(12) United States Patent
Chen et al.

(10) Patent No.: US 9,754,665 B2
(45) Date of Patent: Sep. 5, 2017

(54) VACANCY-MODULATED CONDUCTIVE OXIDE RESISTIVE RAM DEVICE INCLUDING AN INTERFACIAL OXYGEN SOURCE LAYER

(71) Applicant: SANDISK TECHNOLOGIES LLC, Plano, TX (US)

(72) Inventors: Yangyin Chen, Leuven (BE); Christopher J. Petti, Mountain View, CA (US); Kun Hou, Milpitas, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/228,216

(22) Filed: Aug. 4, 2016

(65) Prior Publication Data

US 2017/0221559 A1 Aug. 3, 2017

Related U.S. Application Data

(60) Provisional application No. 62/288,616, filed on Jan. 29, 2016.

(51) Int. Cl.
*G11C 13/00* (2006.01)
*H01L 45/00* (2006.01)
(Continued)

(52) U.S. Cl.
CPC ...... *G11C 13/0007* (2013.01); *G11C 13/0069* (2013.01); *G11C 13/0097* (2013.01); *H01L 23/528* (2013.01); *H01L 27/2481* (2013.01); *H01L 45/08* (2013.01); *H01L 45/1246* (2013.01); *H01L 45/1253* (2013.01); *H01L 45/146* (2013.01); *H01L 45/1608* (2013.01); *G11C 2013/0078* (2013.01);
(Continued)

(58) Field of Classification Search
CPC ........................................................ H01L 41/08
USPC ............................................................. 257/4
See application file for complete search history.

(56) References Cited

U.S. PATENT DOCUMENTS 5,915,167 A 6/1999 Leedy
7,800,934 B2 9/2010 Kumar et al.
(Continued)

FOREIGN PATENT DOCUMENTS

WO WO2007-004843 A1 1/2007

OTHER PUBLICATIONS

B. Govoreanu et al., Vacancy-Modulated Conductive Oxide Resistive RAM (VMCO-RRAM): An Area-Scalable Switching Current, Self Compliant, Highly Nonlinear and Wide On/Off-Window Resistive Switching Cell, IEDM13, 2013, pp. 256-259, Leuven-Belgium.
(Continued)

*Primary Examiner* — Min Hung
(74) *Attorney, Agent, or Firm* — The Marbury Group PLLC

(57) ABSTRACT

A vacancy-modulated conductive oxide (VMCO) resistive random access memory (ReRAM) device includes at least one interfacial layer between a semiconductor portion and a titanium oxide portion of a resistive memory element. The at least one interfacial layer includes an oxygen reservoir that can store oxygen atoms during operation of the resistive memory element. The at least one interfacial layer can include an interfacial metal oxide layer, a metal layer, and optionally, a ruthenium layer.

18 Claims, 26 Drawing Sheets

(51) Int. Cl.
*H01L 23/528* (2006.01)
*H01L 27/24* (2006.01)

(52) U.S. Cl.
CPC ...... *G11C 2213/32* (2013.01); *G11C 2213/52* (2013.01); *G11C 2213/55* (2013.01); *G11C 2213/71* (2013.01)

(56) References Cited

U.S. PATENT DOCUMENTS

| | | | |
|---|---|---|---|
| 8,389,971 | B2 | 3/2013 | Chen et al. |
| 8,724,369 | B2* | 5/2014 | Zhang .................... H01L 45/08 365/148 |
| 9,343,507 | B2 | 5/2016 | Takaki |
| 9,397,145 | B1* | 7/2016 | Sills .................... H01L 27/2418 |
| 2010/0243983 | A1* | 9/2010 | Chiang .............. G11C 13/0007 257/4 |
| 2011/0227026 | A1* | 9/2011 | Sekar ................. G11C 13/0007 257/4 |
| 2011/0266510 | A1* | 11/2011 | Quitoriano ............. B82Y 10/00 257/2 |
| 2013/0043455 | A1 | 2/2013 | Bateman |
| 2013/0051121 | A1* | 2/2013 | Yang ...................... B82Y 10/00 365/148 |
| 2014/0092666 | A1* | 4/2014 | Karpov .............. G11C 13/0007 365/148 |
| 2014/0197369 | A1* | 7/2014 | Sheng ................. H01L 45/1608 257/4 |
| 2014/0269002 | A1* | 9/2014 | Jo ........................ H01L 45/145 365/148 |
| 2014/0374689 | A1* | 12/2014 | Karpov ................ H01L 45/146 257/4 |
| 2015/0188043 | A1 | 7/2015 | Wang |
| 2015/0263069 | A1 | 9/2015 | Jo |
| 2015/0287915 | A1* | 10/2015 | Chang .................... H01L 45/06 257/4 |
| 2016/0043143 | A1 | 2/2016 | Sakotsubo |
| 2016/0197271 | A1* | 7/2016 | Gassilloud ............ H01L 27/101 257/4 |

OTHER PUBLICATIONS

S.H. Jo et al., "Cross-Point Resistive RAM Based on Field-Assisted Superlinear Threshold Selector", IEEE Transactions on Electron Devices, vol. 62 No. 11, Nov. 2015, pp. 3477-3481.

L. Zhang, "Study of the Selector Element for Resistive Memory"), Ku Leuven Arenberg Doctoral School-Faculty of Engineering of Science, Oct. 2015, pp. 232, Haverly-Belgium.

U.S. Appl. No. 15/157,945, filed May 18, 2016, SanDisk Technologies LLC.

International Search Report and Written Opinion of the International Searching Authority for PCT/US2016/067605, dated Apr. 6, 2017, 12 pages.

* cited by examiner

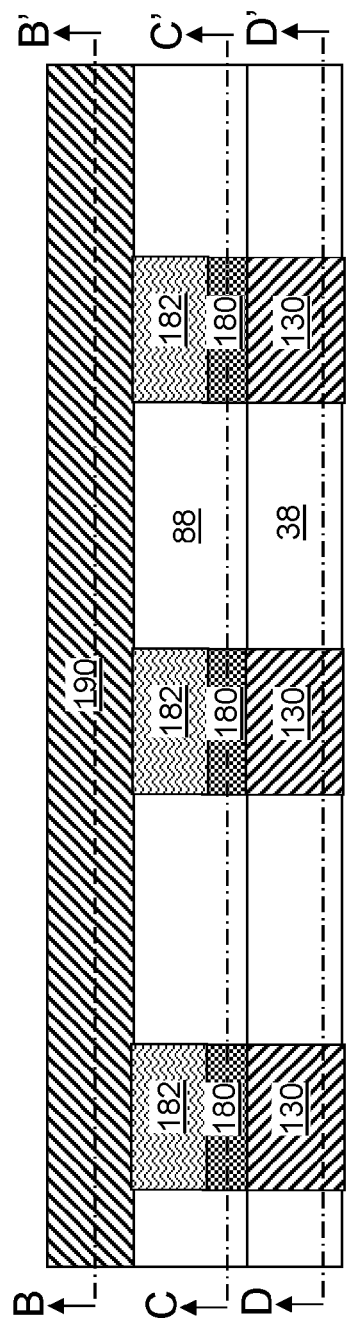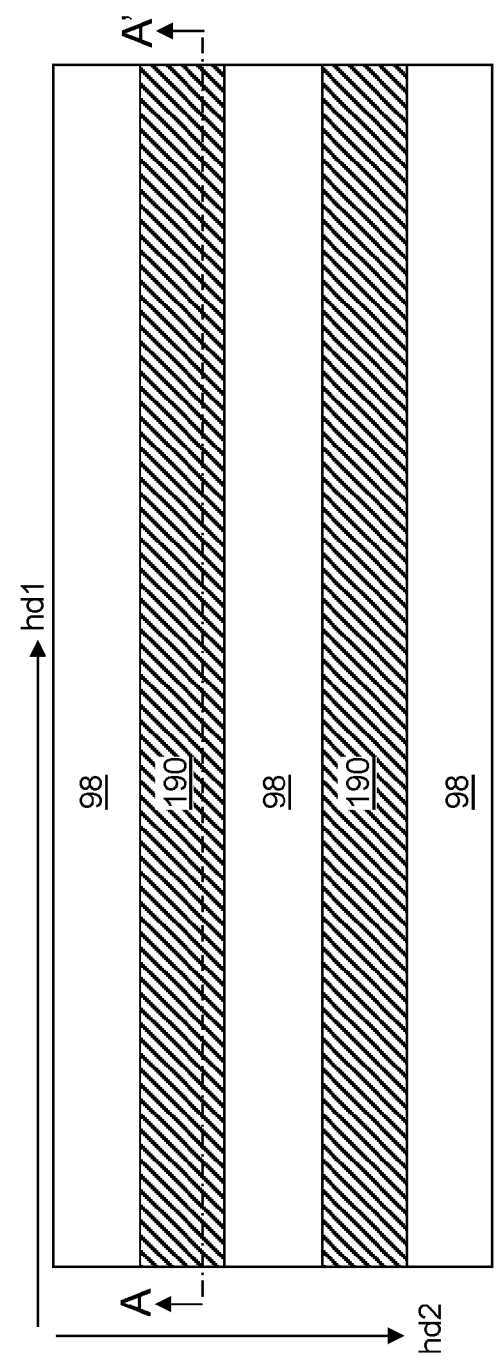
FIG. 9A
FIG. 9B

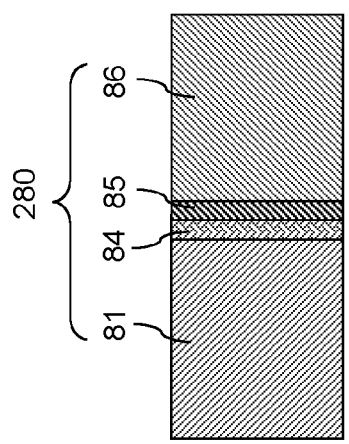
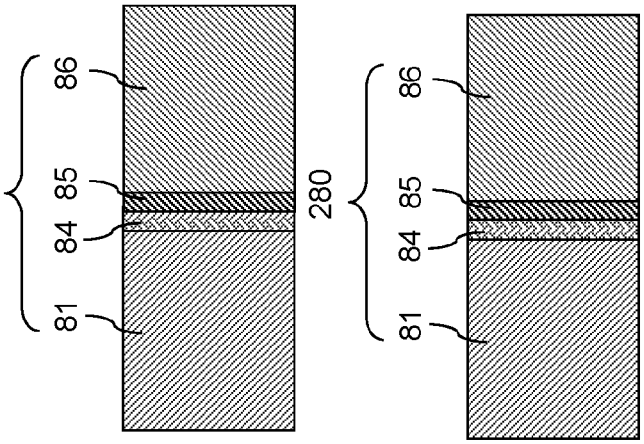
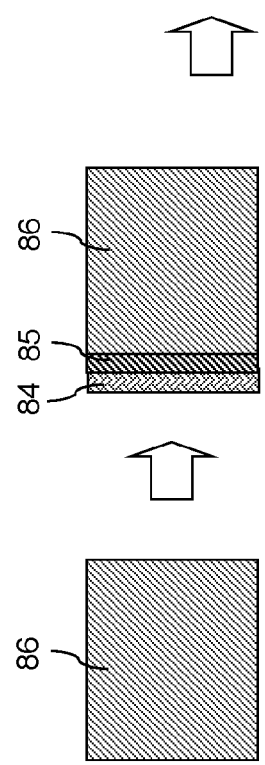
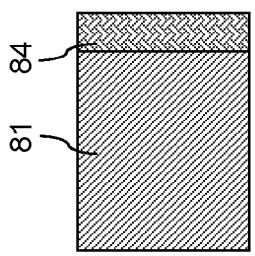
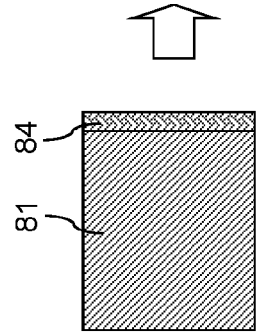
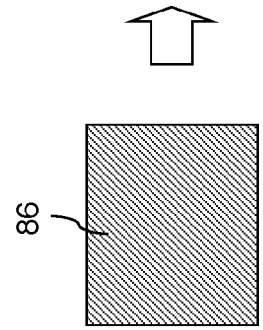
FIG. 14A
FIG. 14B
FIG. 14C

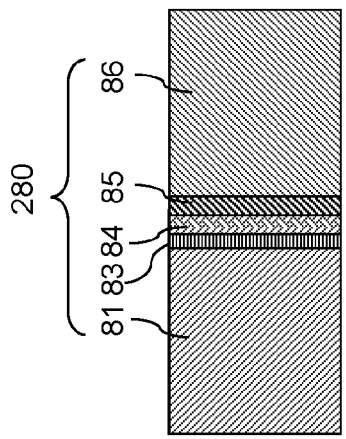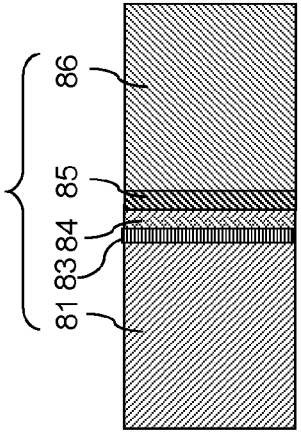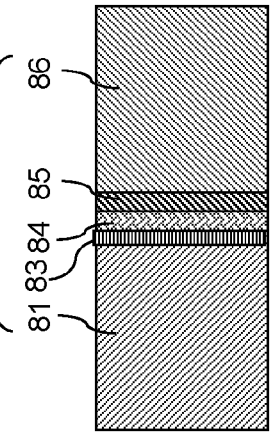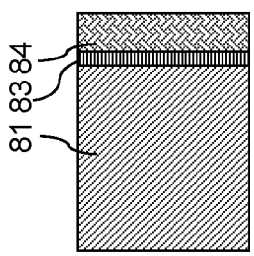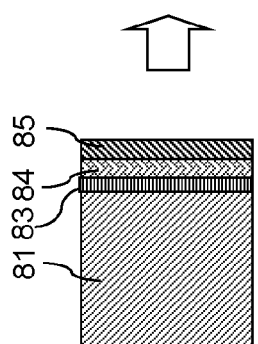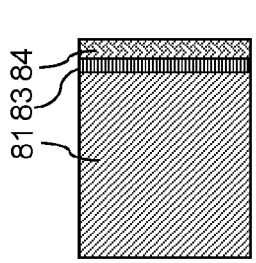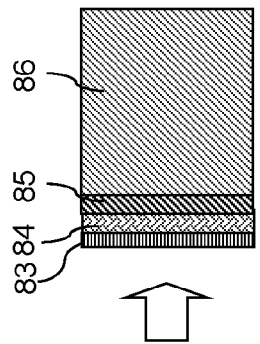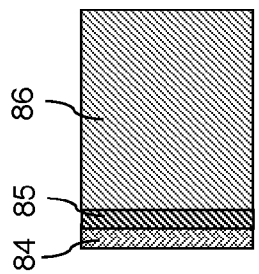
FIG. 16A
FIG. 16B
FIG. 16C

VACANCY-MODULATED CONDUCTIVE OXIDE RESISTIVE RAM DEVICE INCLUDING AN INTERFACIAL OXYGEN SOURCE LAYER

RELATED APPLICATIONS

The instant application claims the benefit of priority of U.S. Provisional Patent Application Ser. No. 62/288,616 filed on Jan. 29, 2016, the entire contents of which are incorporated herein by reference.

FIELD

The present disclosure relates generally to the field of semiconductor devices and specifically to three-dimensional non-volatile memory devices, such as a three-dimensional resistive random access memory (ReRAM) devices, and methods of making the same.

BACKGROUND

Resistance Random Access Memory, or "ReRAM," is a non-volatile memory device employing reversible change in resistance in a thin film with application of electrical voltage bias across the film. Application of the electrical voltage bias in one manner can cause decrease in the resistance of the thin film, for example, by formation of filaments that function as leakage current paths or by increasing a crystallinity of the thin film. Application of a different type of electrical voltage bias can cause reversal of the resistance of the thin film to an original high-resistance state, such as by removal of the filaments from the thin film or by decreasing the crystallinity of the thin film.

Thus, data can be stored in a ReRAM cell by changing the resistance of the thin film, which can be a solid-state material. The thin film is referred to as a memory film or a read/write film. Examples of ReRAM devices are described in World Intellectual Property Organization (WIPO) Publication No. WO2007004843 A1 to Hong et al. and U.S. Patent Application Publication No. 2013/0043455 A1 to Bateman.

A vacancy-modulated conductive oxide (VMCO) resistive random access memory (ReRAM) device is a ReRAM in which the resistance of a memory element is modulated by separation or recombination of oxygen vacancies and interstitial oxygen ions. When the interstitial oxygen ions combine with the oxygen vacancies, a zone with a low density of charge carriers is formed due to elimination of oxygen vacancies, thereby increasing the resistance of the memory element. This operation is herein referred to as a "resetting" operation. When the oxygen ions are separated from the oxygen vacancies, a zone with a high density of charge carriers is formed due to the presence of vacancies, thereby decreasing the resistance of the memory element. This operation is herein referred to as a "setting" operation.

SUMMARY

According to an aspect of the present disclosure, a vacancy-modulated conductive oxide resistive memory element includes a semiconductor material portion, a titanium oxide portion, and at least one layer disposed between the semiconductor material portion and the titanium oxide portion. The at least one layer is selected from of a metal layer selected from Ti, Zr, Hf, Ta, Nb, and V, and an interfacial metal oxide layer consisting essentially of oxygen and at least one elemental metal selected from Ti, Zr, Hf, Ta, Nb, and V.

According to yet another aspect of the present disclosure, a method of operating a resistive memory element comprising a semiconductor material portion, a titanium oxide portion and a metal layer disposed between the semiconductor material portion and the titanium oxide portion includes applying a set voltage to the element to generate oxygen interstitials and oxygen vacancies in the titanium oxide portion and to diffuse the oxygen interstitials to the metal layer to form an oxygen reservoir, and applying a reset voltage to the element to diffuse oxygen from the oxygen reservoir into the titanium oxide portion to provide oxygen interstitials which recombine with the oxygen vacancies in the titanium oxide portion.

According to yet another aspect of the present disclosure, a method of forming a resistive memory element, which comprises forming a combination of a semiconductor material portion and a titanium oxide portion with at least one interfacial layer therebetween, wherein the at least one interfacial layer comprises an element selected from Ti, Zr, Hf, Ta, Nb, and V and intermetallic alloys thereof.

BRIEF DESCRIPTION OF THE DRAWINGS

FIG. 9A is a vertical cross-sectional view of a third exemplary structure including a resistive random access memory device that includes a rectangular grid array of resistive memory elements and optional steering elements according to an embodiment of the present disclosure.

FIG. 9B is a horizontal cross-sectional view of the third exemplary structure of FIG. 9A along the horizontal plane B-B'. The vertical plane A-A' is the plane of the cross-section for FIG. 9A.

FIG. 14A illustrates a first exemplary manufacturing process for forming the first exemplary resistive memory element of FIGS. 13A and 13B according to an embodiment of the present disclosure.

FIG. 14B illustrates a second exemplary manufacturing process for forming the first exemplary resistive memory element of FIGS. 13A and 13B according to an embodiment of the present disclosure.

FIG. 14C illustrates a third exemplary manufacturing process for forming the first exemplary resistive memory element of FIGS. 13A and 13B according to an embodiment of the present disclosure.

FIG. 16A illustrates a first exemplary manufacturing process for forming the second exemplary resistive memory element of FIGS. 15A and 15B according to an embodiment of the present disclosure.

FIG. 16B illustrates a second exemplary manufacturing process for forming the second exemplary resistive memory element of FIGS. 15A and 15B according to an embodiment of the present disclosure.

FIG. 16C illustrates a third exemplary manufacturing process for forming the second exemplary resistive memory element of FIGS. 15A and 15B according to an embodiment of the present disclosure.

DETAILED DESCRIPTION

Figure 1A:
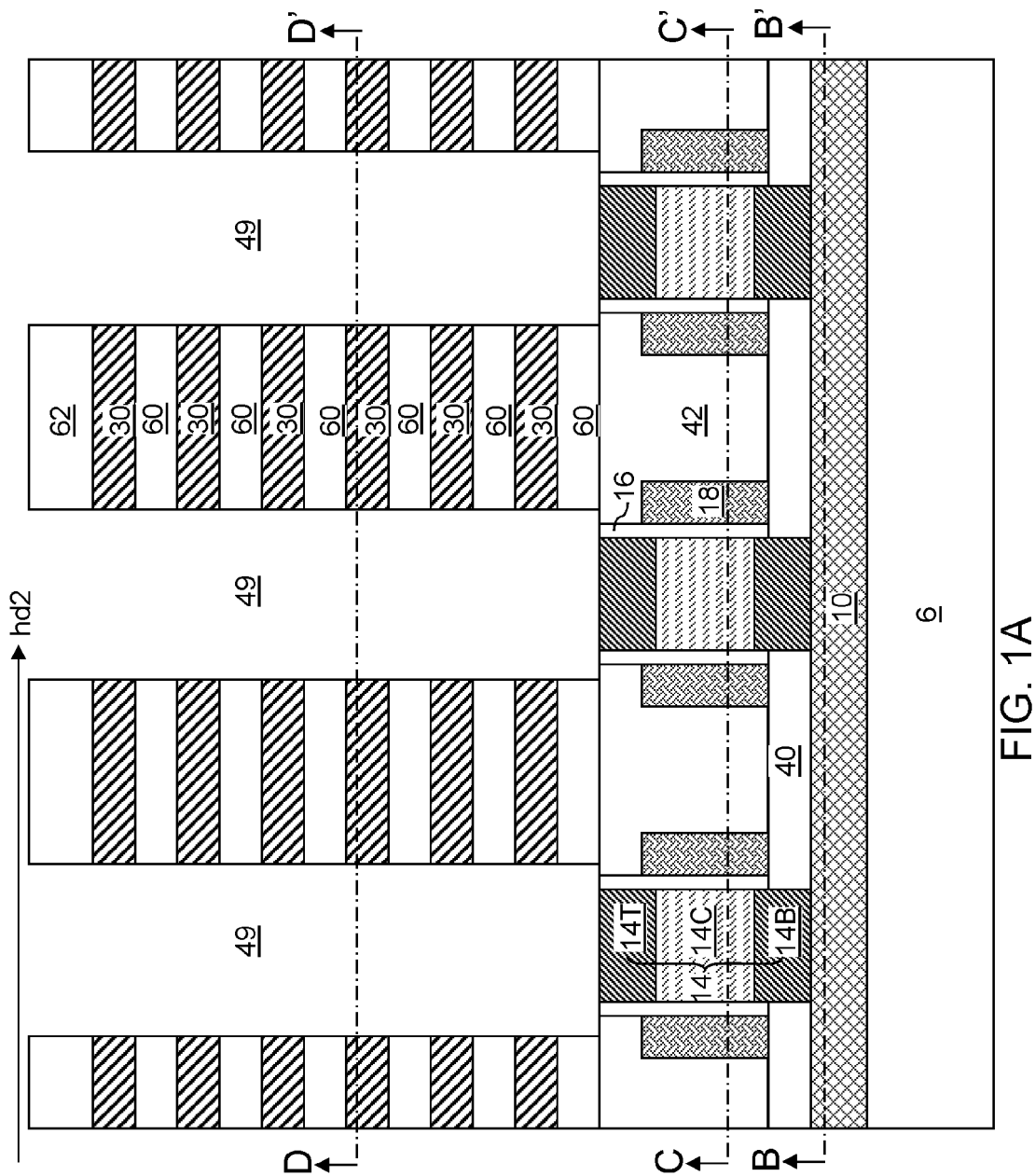
FIG. 1A is a vertical cross-sectional view of a first exemplary structure for forming a resistive random access memory device after formation of bit line access transistors, a dielectric fill layer, and a patterned alternating stack of insulating layers and conductive material layers according to an embodiment of the present disclosure.
Figure 1B:
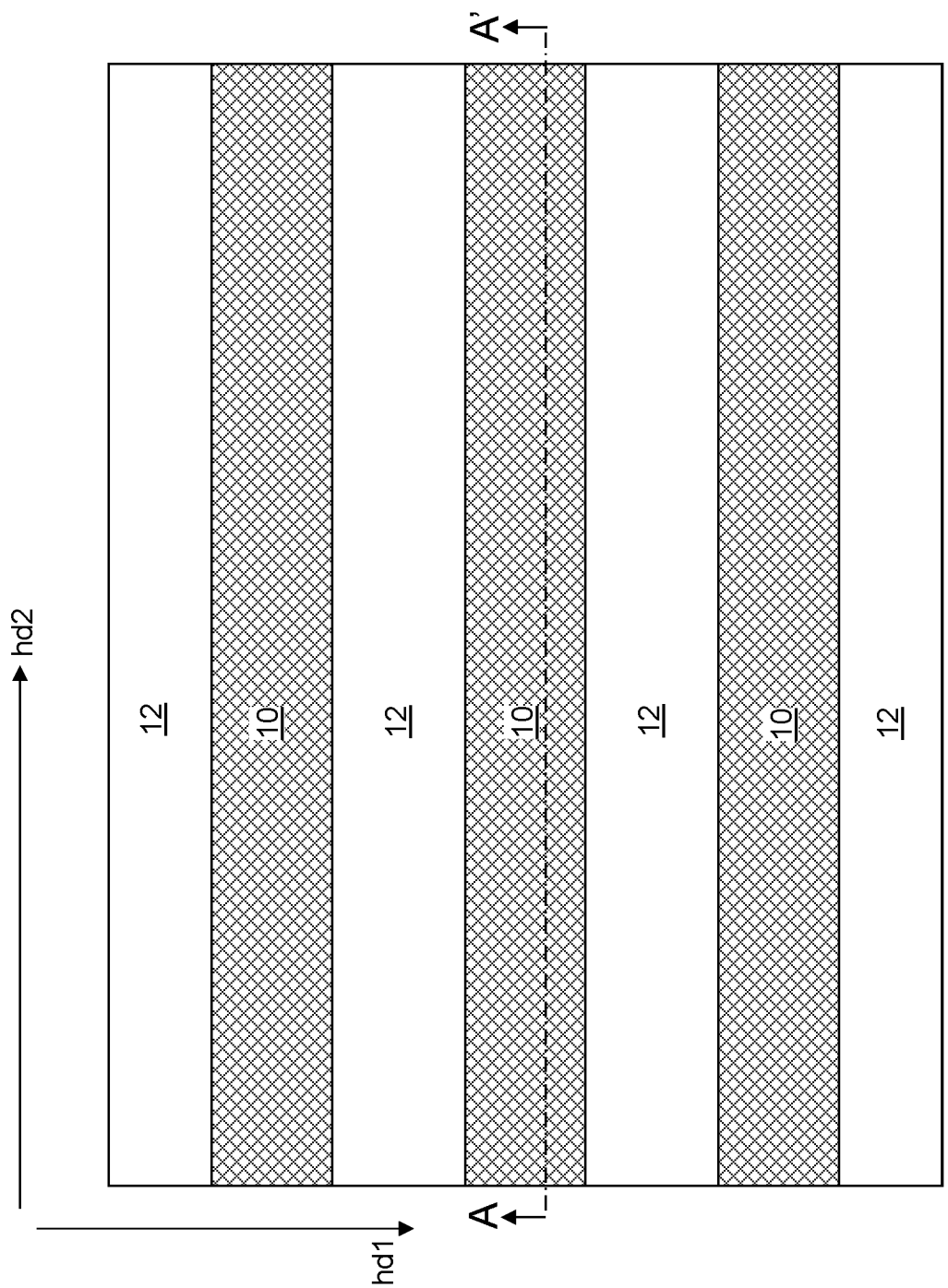
FIG. 1B is a horizontal cross-sectional view of the first exemplary structure of FIG. 1A along the horizontal plane B-B'. The vertical plane A-A' is the plane of the cross-section for FIG. 1A.
Figure 1C:
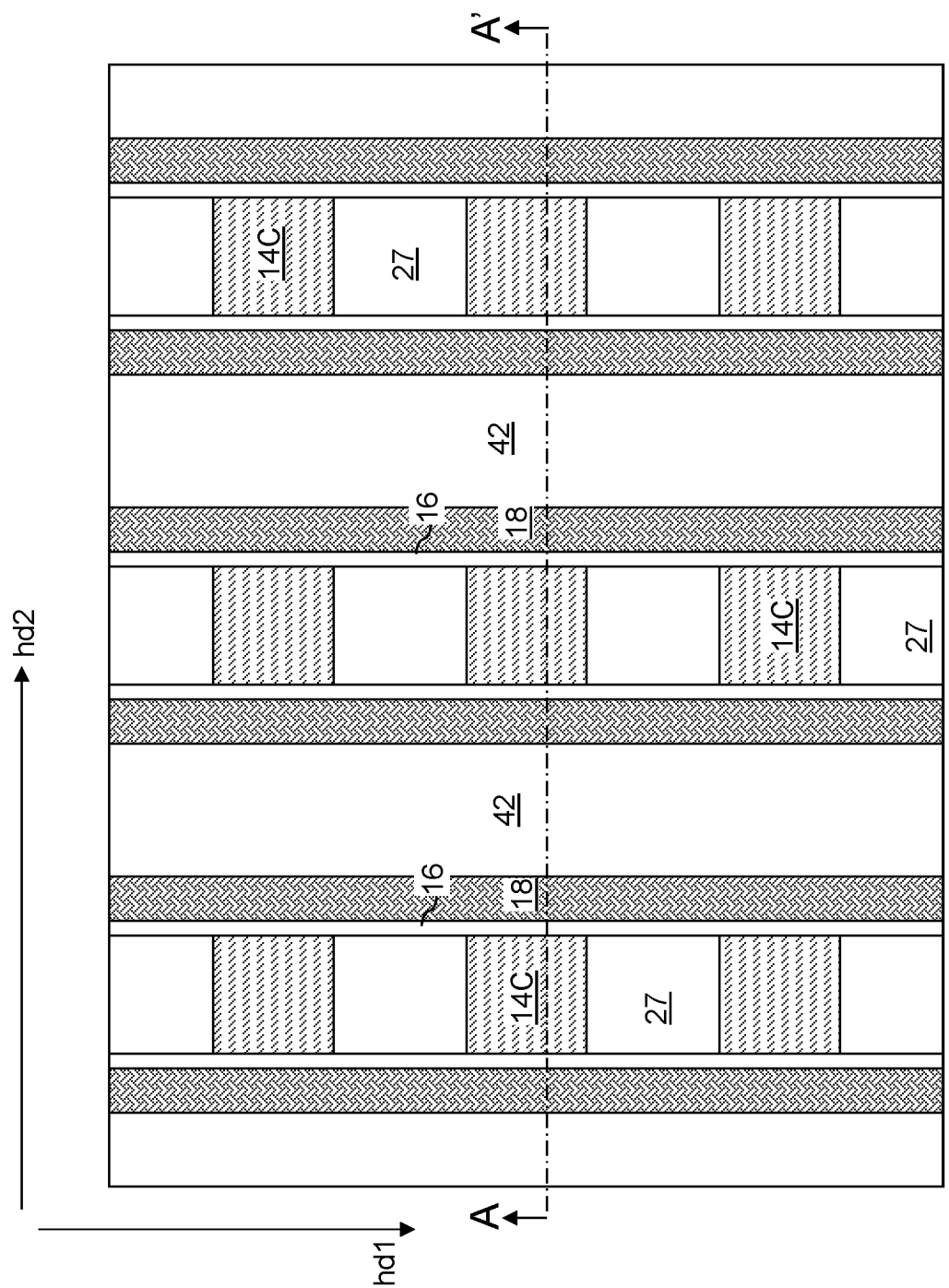
FIG. 1C is a horizontal cross-sectional view of the first exemplary structure of FIG. 1A along the horizontal plane C-C'. The vertical plane A-A' is the plane of the cross-section for FIG. 1A.
Figure 1D:
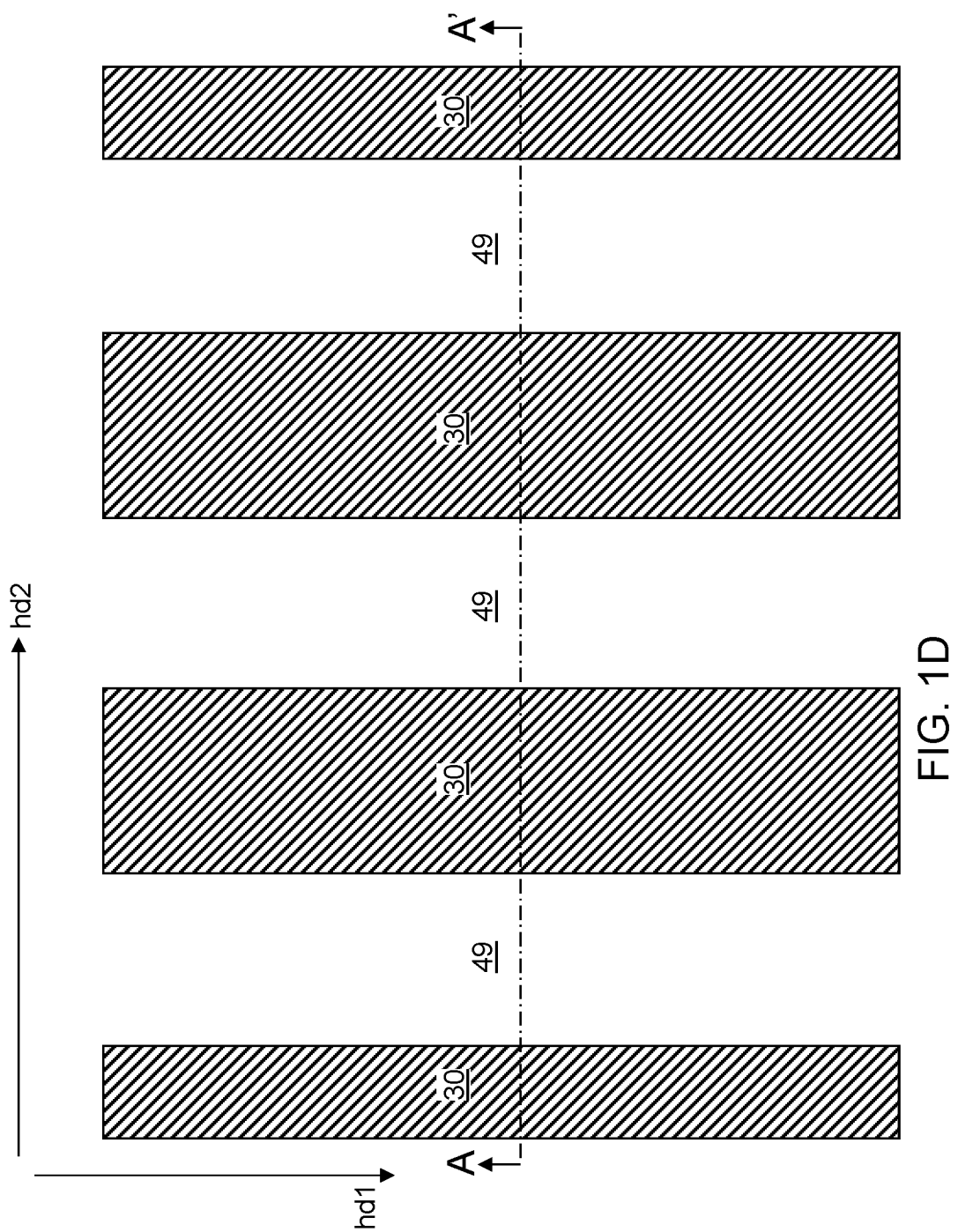
FIG. 1D is a horizontal cross-sectional view of the first exemplary structure of FIG. 1A along the horizontal plane D-D'. The vertical plane A-A' is the plane of the cross-section for FIG. 1A.

As discussed above, the present disclosure is directed to a three-dimensional resistive random access memory (ReRAM) devices and other three-dimensional devices, and methods of making the same, the various aspects of which are described below. The embodiments of the disclosure can be employed to form various semiconductor devices such as three-dimensional monolithic memory array devices comprising ReRAM devices. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "layer" refers to a material portion including a region having a thickness. A layer may extend over the entirety of an underlying or overlying structure, or may have an extent less than the extent of an underlying or overlying structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays.

The various three dimensional memory devices of the present disclosure can include a ReRAM device, and can be fabricated employing the various embodiments described herein. It is understood that a criss-cross array of memory elements that can be accessed by any access scheme can be employed for the resistive memory devices of the present disclosure, and the exemplary structures of the present disclosure are described herein merely provide non-limiting examples of implementation of the memory devices of the present disclosure.

Referring to FIGS. 1A-1D, a first exemplary structure for forming a resistive random access memory device is illustrated, which can be an in-process ReRAM device. As used herein, a "prototype" structure or an "in-process" structure refers to a transient structure that is subsequently modified in the shape or composition of at least one component therein.

The first exemplary structure includes a substrate 6, which includes an insulating layer at an upper portion thereof. In one embodiment, the substrate 6 can be a stack of at least two material layers such as a stack of an underlying substrate material layer and an overlying substrate insulating layer. The substrate material layer can be a semiconductor material layer, a conductive material layer, or an insulating material layer that can provide structural support to the overlying structures, and may have a thickness greater than 50 microns, and typically in a range between 300 microns and 3 mm. In one embodiment, the substrate material layer can be a semiconductor wafer, such as a silicon wafer as known in the art. The substrate insulating layer can include an insulating material, and can have a thickness in a range from 100 nm to 3 microns, although lesser and greater thicknesses can also be employed.

In case the substrate material layer includes a semiconductor material, peripheral semiconductor devices for operation of a memory array device can be formed in, or on, the substrate material layer. For example, sense amplifiers, input-output (I/O) circuitry, control circuitry, and any other necessary peripheral circuitry can be formed on, or in, the substrate material layer. Additional devices that can be formed in, or on, the substrate material layer include, but are not limited to, global bit line select transistors for selecting global bit lines to be activated, local bit line select transistors for selecting local bit lines to be activated, and word line select transistor for selecting word lines to be activated.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0$—$10^{5}$ S/cm. As used herein, an "insulating material" or a "dielectric material" refers to a material having electrical conductivity less than $1.0 \times 10^{-6}$ S/cm. A "semiconducting material" refers to a material having electrical conductivity in a range from $1.0 \times 10^{-6}$ S/cm to $1.0 \times 10^{5}$ S/cm. All measurements for electrical conductivities are made at the standard condition.

Global bit lines 10 are formed over the substrate 6. The global bit lines 10 are parallel electrically conductive lines that are laterally spaced apart in a first horizontal direction hd1, and extending in a second horizontal direction hd2. The global bit lines 10 can be formed, for example, by depositing at least one conductive material layer, and patterning the at least one conductive material layer employing a combination of lithographic methods and an anisotropic etch. The at least one conductive material layer can include, for example, at least one elemental metal (such as W, Co, Cu, and Al), a conductive doped semiconductor material, an intermetallic alloy including at least two elemental metals, a conductive metallic nitride, or a conductive metallic carbide. For example, the at least one conductive material layer can include a metallic barrier layer (such as a layer of TiN, TaN, or WN) and a metal layer (such as a layer of W, Ti, Ta, Cu, Al, or an alloy thereof). The space between the global bit lines 10 can be filled with a dielectric material (such as silicon oxide). The dielectric material can be subsequently planarized to remove excess portions from above a horizontal plane including the top surfaces of the global bit lines 10 to form separator dielectric material portions 12. Each global bit lines 10 and each separator dielectric material portions 12 can extend along the second horizontal direction hd2. A one-dimensional array of the global bit lines 10 and the separator dielectric material portions 12 can extend along the first horizontal direction hd2 with a periodicity that is equal to the sum of the width of a global bit line 10 and the width of a separator dielectric material portion 12. Alternatively, the one-dimensional array of the global bit lines 10 and the separator dielectric material portions 12 may be formed by depositing a dielectric material layer, forming trenches extending along the second horizontal direction hd2 and laterally spaced from one another along the first horizontal direction hd1, and filling the trenches with at least one conductive material to form the global bit lines 10 therein.

A two-dimensional array of select devices can be formed on the global bit lines 10 such that multiple select devices are formed on each global bit line 10. In one embodiment, the select devices can be transistor such as vertical thin film transistors employing a polycrystalline semiconductor channel. Examples of suitable transistors for the select devices are described, for example, in U.S. patent application Ser. No. 14/206,196, filed Mar. 12, 2014, which is incorporated by reference herein in its entirety. In case the select devices are field effect transistors, the select transistors are herein referred to access transistors.

Bit line access transistors are subsequently formed on global bit line 10. Each access transistor can be a vertical field effect transistor, and can include a bottom active region 14B (which can be a source region or a drain region), a semiconductor channel 14C, and a top active region 14T (which can be a drain region if the underlying bottom active region 14B is a source region, and a source region if the underlying bottom active region 14C is a drain region). As used herein, an "active region" refers to a source region or a drain region.

The bit line access transistors can be formed by forming a semiconductor layer stack 14 including a first doped semiconductor layer for forming the bottom active regions 14B, a semiconductor channel material layer for forming the semiconductor channels 14C, and a second doped semiconductor layer for forming the top active regions 14T, which has a same type of doping as the first doped semiconductor layer. The semiconductor layer stack 14 is patterned employing a combination of lithographic methods and an anisotropic etch such that each patterned portion of the semiconductor layer stack 14 overlies an area of a respective global bit line 10 and is laterally spaced from one another by trenches extending along the second horizontal direction hd2. Subsequently, a dielectric material (such as silicon nitride and/or silicon oxide) is deposited in the trenches and planarized to remove the dielectric material from above rails of the semiconductor layer stack 14 that extend along the second horizontal direction hd2. The remaining portions of the semiconductor layer stack 14 and the planarized dielectric material portions constitute alternating rail structures in which rails of semiconductor layer stack 14 and rails of the planarized dielectric material extend along the second horizontal direction hd2 and alternate along the first horizontal direction hd1.

The remaining portions of the semiconductor layer stack 14 and the planarized dielectric material portions are patterned to form trenches that extend along the first horizontal direction hd1. Each patterned portion of the semiconductor layer stack 14 includes a vertical stack of a bottom active region 14B, a semiconductor channel 14C, and a top active region 14T. Each patterned portion of the dielectric material constitutes a dielectric pillar structure 27, which can be located between a pair of vertical stacks of a bottom active region 14B, a semiconductor channel 14C, and a top active region 14T that are spaced from each other along the first horizontal direction hd1. Each alternating sequence of dielectric pillar structures 27 and vertical stacks of a bottom active region 14B, a semiconductor channel 14C, and a top active region 14T that extend along the first horizontal direction hd1 forms a composite rail structure (14B, 14C, 14T, 27). The composite rail structures (14B, 14C, 14T, 27) are laterally spaced from one another along the second horizontal direction hd2. Top surfaces of the global bit lines 10 and the separator dielectric portions 12 can be physically exposed at the bottom of each trench that laterally extends along the first horizontal direction hd1.

A spacer dielectric layer 40 can be formed at the bottom the trenches by depositing a self-planarizing dielectric material (such as spin-on glass) or by filling the trenches with a dielectric material (such as organosilicate glass), planarizing the deposited dielectric material, and recessing the dielectric material selective to the dielectric pillar structures 27 and the vertical stacks of the bottom active regions 14B, the semiconductor channels 14C, and the top active regions 14T. Each spacer dielectric layer 40 can be formed over of the global bit lines 10 and the separator dielectric material portions 12 such that the top surface of the spacer dielectric layer 40 is located at a target height for placing a bottom edge of gate electrodes 18 to be subsequently formed. For example, the top surface of the spacer dielectric layer 40 can be at a level about the interface between the remaining portions of the first conductivity type semiconductor layer and the channel material layer.

The gate dielectrics 16 and the gate electrodes 18 of the access transistors can be subsequently formed, for example, by depositing a conformal gate dielectric layer (e.g., silicon oxide) and a conformal conductive material layer (e.g., heavily or degenerately doped polysilicon) in the trenches that separate the one-dimensional array of rail structures, and by anisotropically etching the conformal conductive material layer. The remaining vertical portions of the conformal conductive material layer constitute the gate electrodes 18, which extend along the first horizontal direction hd1. Each remaining portion of the conformal gate dielectric layer constitutes a gate dielectric 16. Each gate electrode 18 is laterally spaced from an adjacent rail structure by a vertical portion of a gate dielectric 16.

Remaining volumes of the trenches are filled with at least one dielectric material. Excess portions of the at least one dielectric material can be removed from above the horizontal plane including the top surfaces of the rail structures (which include contiguous portions of the semiconductor layer stack 14 and the dielectric pillar structures 27 that are present between a pair of trenches) by a planarization process, which can employ, for example, chemical mechanical planarization. Each remaining portion of the deposited dielectric material in the trenches constitutes a dielectric rail structure 42.

Each dielectric rail structure 42 extends along the first horizontal direction hd1 parallel to the composite rail structures (14B, 14C, 14T, 27). Each composite rail structure (14B, 14C, 14T, 27) includes remaining portions of the semiconductor layer stack 14 and the dielectric pillar structures 27 between a neighboring pair of dielectric rail structures 42. Each dielectric rail structure 42 can have a substantially vertical bottom portion, or can have a tapered bottom portion in which the width of the dielectric rail structure 42 monotonically or strictly increases as a function of a vertical distance from the substrate 6. In one embodiment, each dielectric rail structure 42 can include at least one dielectric material such as silicon nitride and/or silicon oxide. The dielectric rail structures 42 and the composite rail structures (14T, 14C, 14B, 27) alternate along the second horizontal direction hd2.

Subsequently, an alternating stack of spacer material layers and insulating layers 60 can be formed over the one dimensional array of the dielectric rail structures 42 and the composite rail structures (14B, 14C, 14T, 27). An insulating cap layer 62 can be formed over the alternating stack. In one embodiment, the spacer material layers can be electrically conductive layers 30 that remain in a final device structure. In another embodiment, the spacer material layers can be sacrificial material layers that are subsequently replaced electrically conductive layers, as will be described in more detail below. In one embodiment, the insulating cap layer 62 can include a dielectric material that is different from the dielectric material of the insulating layers 60. For example, the insulating layers 60 can include undoped silicate glass (e.g., silicon oxide) or doped silicate glass, and the insulating cap layer 62 can include silicon nitride or a dielectric metal oxide.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of the electrically conductive layers and the insulating layers may begin with an instance of the electrically conductive layers or with an instance of the insulating layers, and may terminate with an instance of the electrically conductive layers or with an instance of the insulating layers. In one embodiment, an instance of the first elements and an instance of the second elements may form a unit that is repeated with periodicity within the alternating plurality.

Subsequently, the insulating cap layer 62 and the alternating stack of the electrically conductive layers 30 and the insulating layers 60 can be patterned to form line trenches 49 that extend along the first horizontal direction hd1. Each line trench 49 can overlie the area of a respective composite rail structure (14B, 14C, 14T, 27). Each contiguous set of remaining portions of the electrically conductive layers 30 and the insulating layers 60 between a pair of line trenches 49 constitutes an alternating stack (30, 60) that is a rail structure. Each alternating stack (30, 60) overlies a respective dielectric rail structure 42, extends along the first horizontal direction hd1, and is laterally spaced apart from other alternating stacks (30, 60) along the second horizontal direction hd2. Each patterned electrically conductive layer 30 can constitute a word line of a resistive random access memory device. In one embodiment, each alternating stack (30, 60) can have a lesser width along the second horizontal direction hd2 than the underlying dielectric rail structure 42, and can be entirety within the area of the underlying dielectric rail structure 42.

In one embodiment, the electrically conductive layers 30 comprise a first electrically conductive material. In one embodiment, the first electrically conductive material can include an elemental metal, an intermetallic alloy, and/or a conductive metal nitride.

The thickness of the electrically conductive layers 30 can be in a range from 5 nm to 60 nm, although lesser and greater thicknesses can also be employed. The thickness of the insulating lines 60 can be in a range from 5 nm to 60 nm, although lesser and greater thicknesses can also be employed. The thickness of the insulating cap layer 62 can be in a range from 5 nm to 300 nm, although lesser and greater thicknesses can also be employed.

A pair of a conductive material layer 30 and an insulating layer 60 can constitute a unit of repetition in the alternating stack (30, 60) of the electrically conductive layers 30 and the insulating layers 60. The total number of repetitions can be in a range from 8 to 1,024, although lesser and greater number of repetitions can also be employed. Thus, a plurality of alternating stacks (30, 60) of insulating layers 60 and electrically conductive layers 30 is formed over a substrate 6. Each of the insulating layers 60 and the electrically conductive layers 30 extends along the first horizontal direction (i.e., the word line direction) hd1. The alternating stacks (30, 60) are laterally spaced from one another along the second horizontal direction hd2 (i.e., the global bit line direction).

Figure 2A:
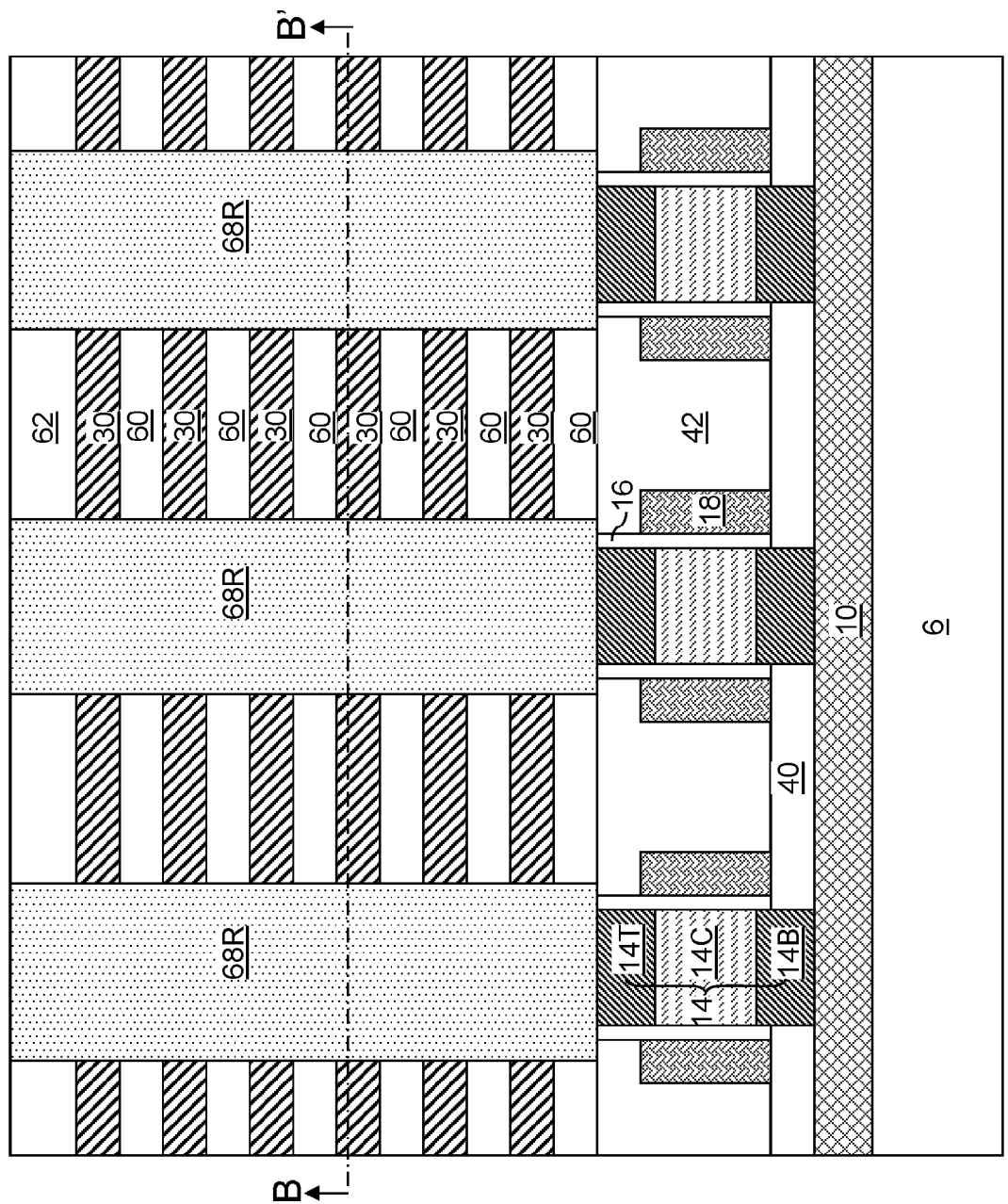
FIG. 2A is a vertical cross-sectional view of the first exemplary structure after formation of dielectric trench fill structures according to an embodiment of the present disclosure.
Figure 2B:
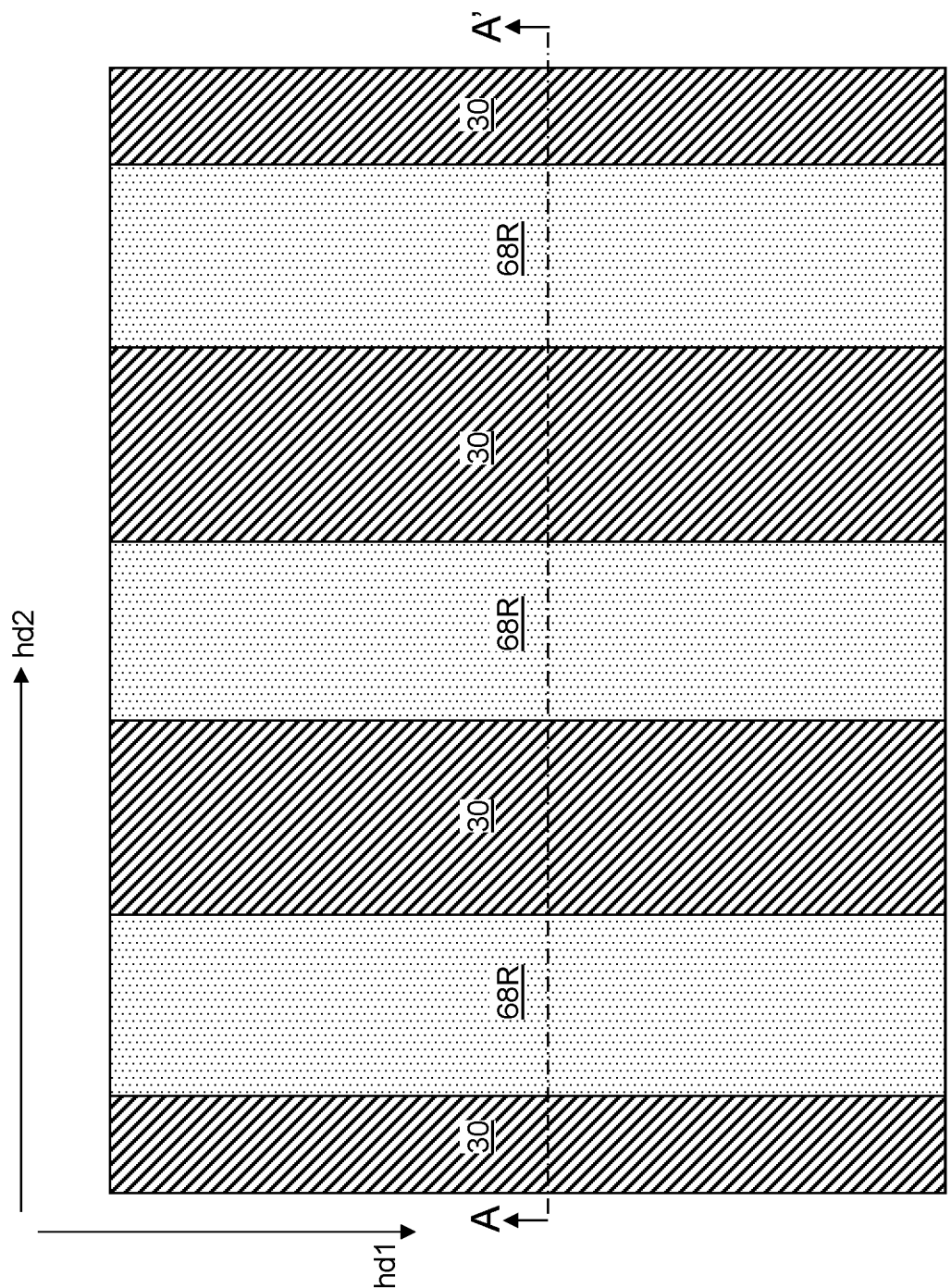
FIG. 2B is a horizontal cross-sectional view of the exemplary structure of FIG. 2A along the horizontal plane B-B'. The vertical plane A-A' is the plane of the cross-section for FIG. 2A.

Referring to FIGS. 2A and 2B, a dielectric material is deposited to fill the line trenches 49. The dielectric material can be removed from above a horizontal plane including the top surfaces of the insulating cap layers 62. Each remaining portion of the dielectric material filling a line trench 49 constitutes a dielectric rail structure, which is herein referred to as separator rail structures 68R. Each separator rail structure 68R extends along the first horizontal direction hd1. The alternating stacks (30, 60) and the separator rail structures 68R can form a one-dimensional array that extends along the second horizontal direction hd2. In one embodiment, the alternating stacks (30, 60) and the separator rail structures 68R can have a periodicity that is equal to the sum of the width of an alternating stack (30, 60) and the width of a separator rail structure 68R. The separator rail structures 68R includes a dielectric material such as doped silicate glass, undoped silicate glass (e.g., silicon oxide), silicon nitride, organosilicate glass, or porous derivatives thereof. In an illustrative example, the insulating layers 60 can include undoped silicate glass or doped silicate glass, the insulating cap layer 62 can include silicon nitride or a dielectric metal oxide, and the separator rail structures 68R can include doped silicate glass, undoped silicate glass, or organosilicate glass.

Figure 3A:
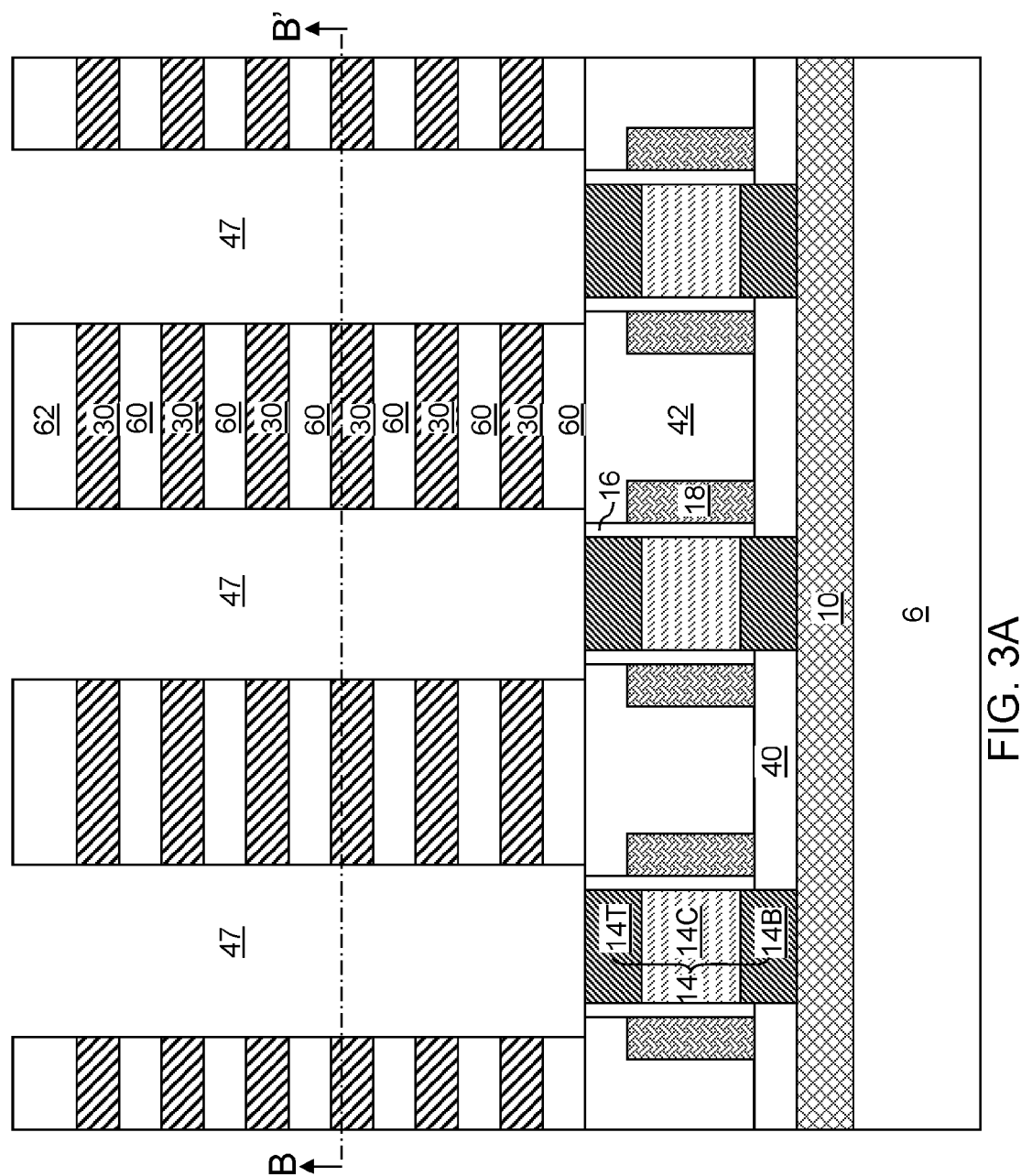
FIG. 3A is a vertical cross-sectional view of the first exemplary structure after formation of dielectric pillar structures and bit line openings according to an embodiment of the present disclosure.
Figure 3B:
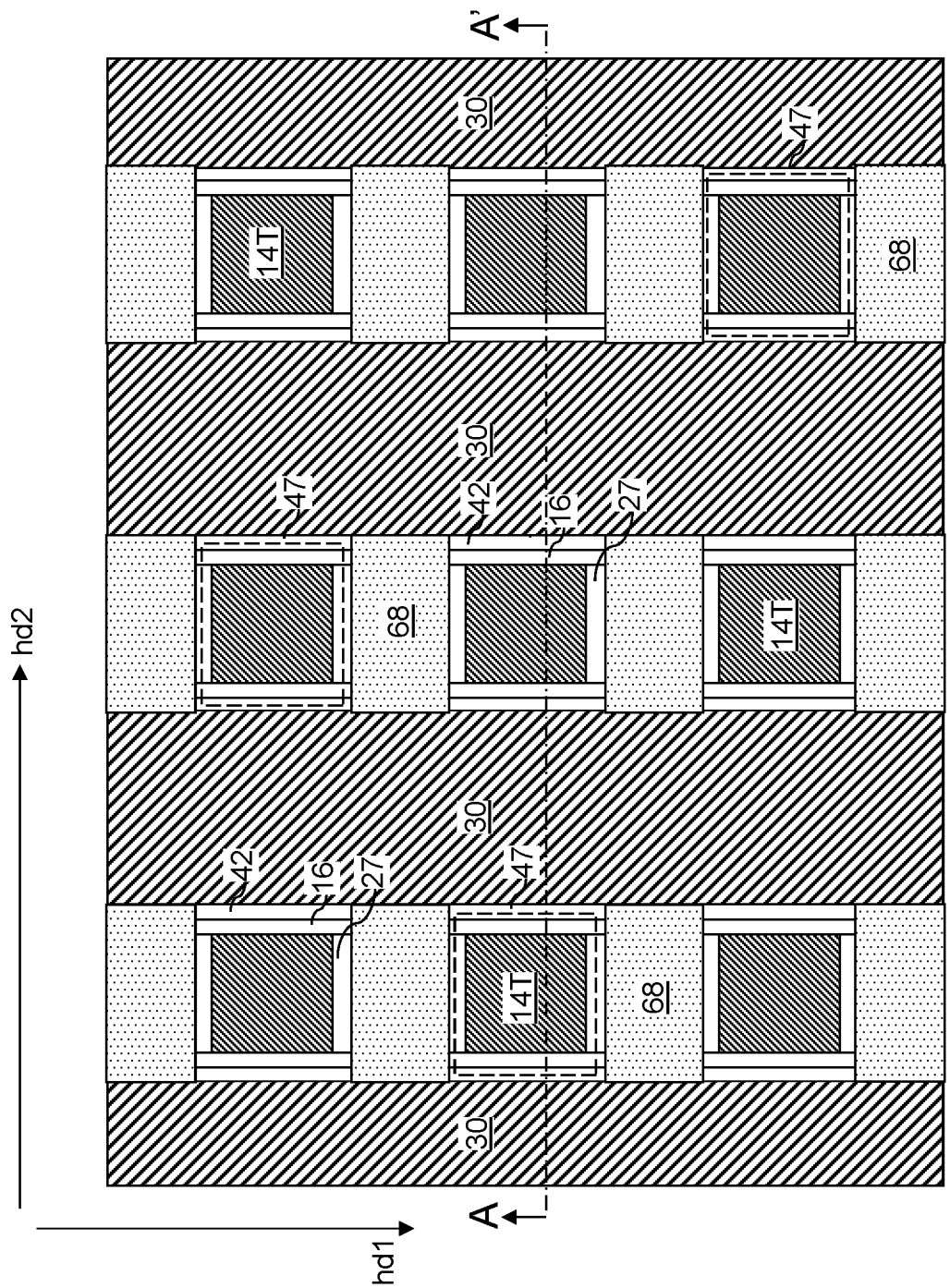
FIG. 3B is a horizontal cross-sectional view of the exemplary structure of FIG. 3A along the horizontal plane B-B'. The vertical plane A-A' is the plane of the cross-section for FIG. 3A.

Referring to FIGS. 3A and 3B, bit line cavities 47 can be formed by patterning the separator rail structures 68R into separator pillar structures 68. Specifically, a photoresist layer (not shown) can be applied over the insulating cap layer 62 and the separator rail structures 68R, and can be lithographically patterned to form linear portions that overlie areas of the separator dielectric material portions 12. Line trenches extending along the second horizontal direction hd2 and overlying areas of the global bit lines 10 are formed between remaining portions of the photoresist layer.

An anisotropic etch that removes the dielectric material of the separator rail structures 68R selective to the dielectric material of the insulating cap layer 62 can be performed to remove portions of the separator rail structures 68R that are not covered by a combination of the photoresist layer portions and insulating cap layer 62. Bit line cavities 47 having rectangular horizontal cross-sectional areas and extending through the alternating stacks (30, 60) to top surfaces of the top active regions 14T can be formed, thereby separating the separator rail structures 68R into separator pillar structures 68. The bit line cavities 47 can form a two-dimensional rectangular array. The separator pillar structures 68 can form another two-dimensional rectangular array having the same periodicity as the two-dimensional rectangular array of the bit line cavities 47.

While an embodiment in which the area of each bit line cavity 47 is greater than the area of an underlying top active region 14T, embodiments are expressly contemplated herein in which the area of each bit line cavity 47 is substantially the same as, or is less than, the area of an underlying top active region 14T. Further, the geometrical center of each bit line cavity 47 may be located on a vertical line passing through the geometrical center of an underlying vertical stack of a bottom active region 14B, a semiconductor channel 14C, and a top active region 14T, or may be laterally offset from the vertical line due to an overlay variation during the patterning processes employed to form pattern the alternating stacks (30, 60) and the separator pillar structures 68.

Figure 4A:
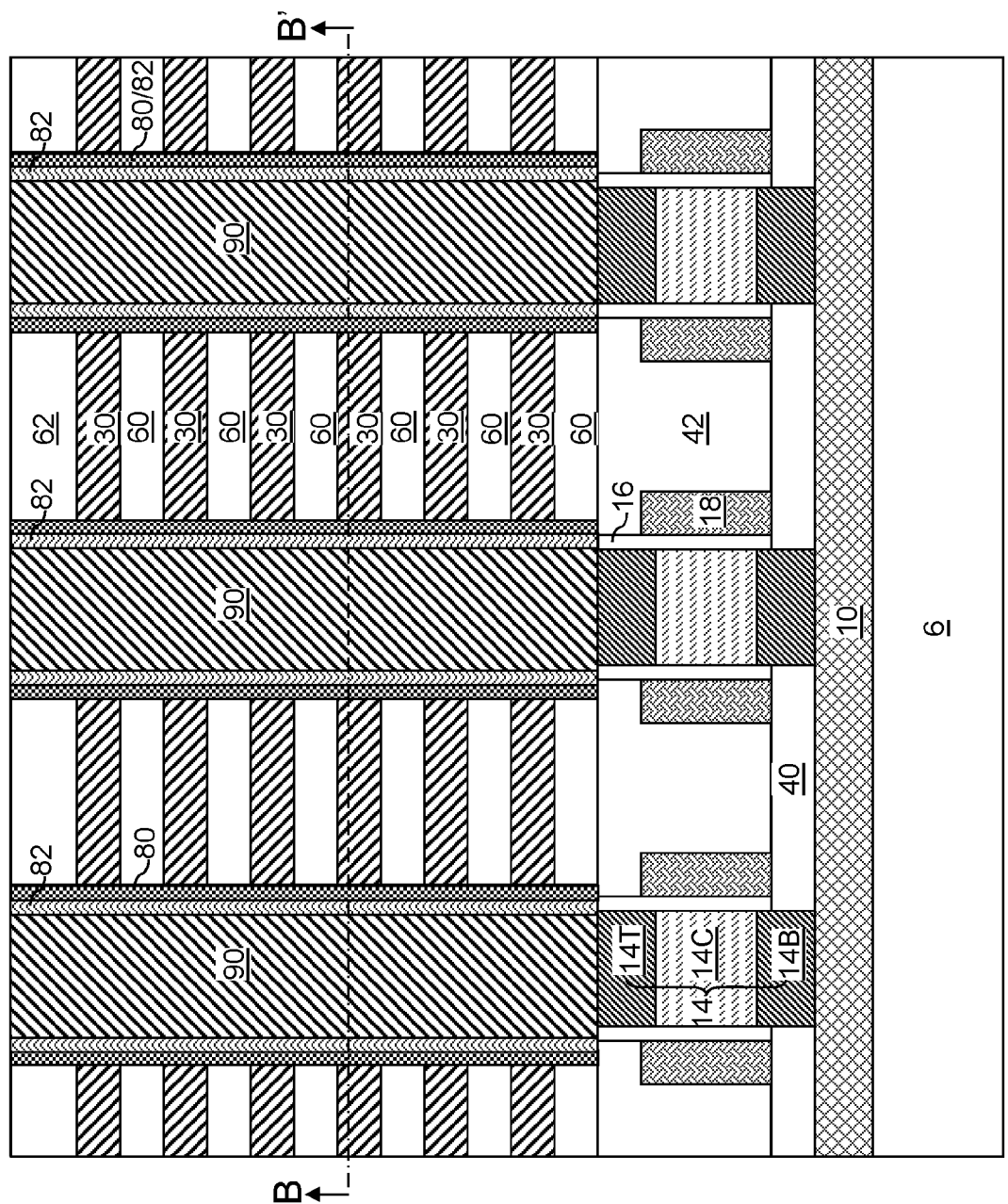
FIG. 4A is a vertical cross-sectional view of the first exemplary structure after formation of resistive memory layers and bit line structures according to an embodiment of the present disclosure.
Figure 4B:
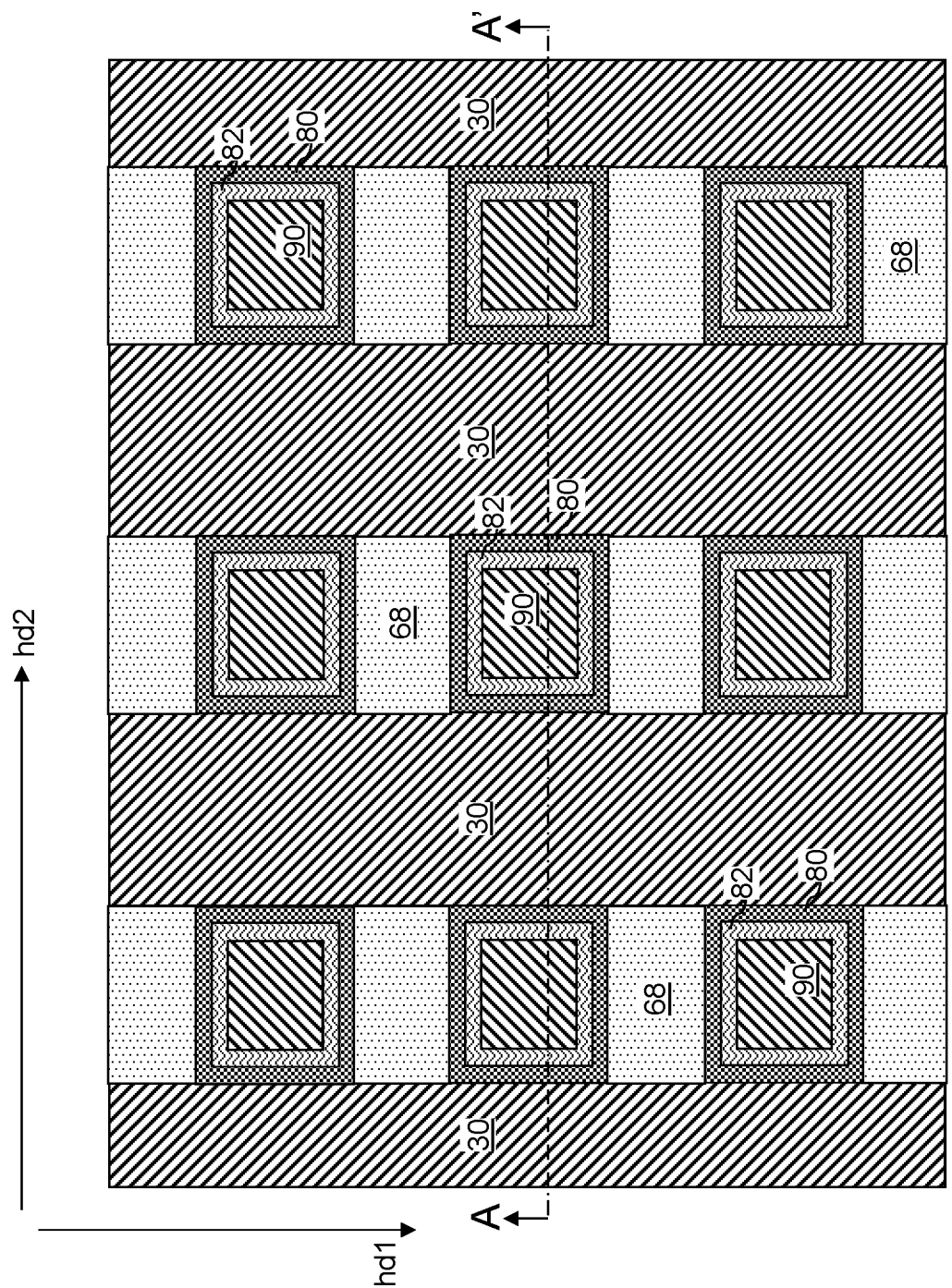
FIG. 4B is a horizontal cross-sectional view of the exemplary structure of FIG. 4A along the horizontal plane B-B'. The vertical plane A-A' is the plane of the cross-section for FIG. 4A.

Referring to FIGS. 4A and 4B, a resistive memory material layer 80 and a steering element layer 82 can be formed on each sidewall of the bit line cavities 47. For example, a continuous resistive memory material layer and a continuous steering element layer can be deposited as continuous layers, and can be anisotropically etched to remove horizontal portions thereof. Each remaining vertical portion of the continuous resistive memory material layer constitutes a resistive memory material layer 80, and each remaining vertical portion of the continuous steering element layer constitutes a steering element layer 82. Each resistive memory material layer 80 can be topologically homeomorphic to a torus, and each steering element layer 82 can be topologically homeomorphic to a torus. As used herein, an element is "topologically homeomorphic to a torus" if the element has a geometrical shape that can be continuously stretched to match a torus without creating or destroying a new hole.

Each resistive memory material layer 80 includes a layer or a layer stack that can provide regions of resistive memory elements. Each resistive memory element includes a resistive memory material. As used herein, a "resistive memory material" or a "reversibly resistance-switching material" is a material of which the resistivity can be altered by application of an electrical bias voltage across the material. As used herein, a "resistive memory material layer" refers to a layer including a resistive memory material. As used herein, a "resistive memory element" refers to an element that includes a portion of a resistive memory material in a configuration that enables programming of the resistive memory material into at least two states having different values of electrical resistance. The resistive memory material layer 80 may optionally include a charge carrier barrier layer or tunneling dielectric. As used herein, a "tunneling dielectric" refers to a dielectric material portion in which the predominant mode of electrical current conduction therethrough is charge carrier tunneling such as electron tunneling or hole tunneling. As used herein, a tunneling dielectric layer refers to a layer including at least one tunneling dielectric.

As used herein, a "steering element" refers to an element, such as a diode, that provides a non-linear current-voltage characteristic for electrical current passing therethrough. In one embodiment, the steering element may have an asymmetric current-voltage characteristic (e.g., a diode which conducts current primarily in one direction (asymmetric conductance) and which has a lower resistance to the flow of current in one direction, and a higher resistance in the other direction). As used herein, a "steering element layer" refers to a layer including at least one steering element.

The materials that can be employed for the resistive memory material layers 80 depend on the nature of the resist memory elements therein. Specific configurations of the resistive memory elements of the present disclosure are described in separate sections below.

A charge carrier barrier layer, if employed, may comprise a semiconductor material layer, such as an amorphous silicon or polysilicon layer. A tunneling dielectric layer, if employed as a sub-element within a resistive memory material layer 80, can include a dielectric material through which electron tunneling or hole tunneling can occur. In one embodiment, the tunneling dielectric layer includes a dielectric material having a dielectric constant of at least 7.0. For example, the tunneling dielectric layer can include a dielectric material selected from silicon nitride and aluminum oxide. In one embodiment, the thickness of the tunneling dielectric layer can be in a range from 0.6 nm to 4 nm (such as from 1.0 nm to 3 nm), although lesser and greater thicknesses can also be employed.

The steering element layer 82 is optional. Thus, depending on the configuration of specific resistive random access memory, the steering element layer 82 may, or may not, be present. Generally speaking, steering elements known in the art can be optionally employed in conjunction with the resistive memory material layers 80 of the present disclosure.

The steering element layers 82, if employed, can include at least one semiconductor element that provides a non-linear current-voltage characteristic. For example, the steering element layer can include at least one diode therein. In one embodiment, each diode can include a heavily doped n-doped semiconductor region (i.e., n+ region) having n-type dopants at an atomic concentration greater than $5.0 \times 10^{19}/cm^3$, and a lightly or lighter doped p-doped semiconductor region (i.e., p− or p region) including p-type dopants at an atomic concentration less than $5.0 \times 10^{19}/cm^3$. Alternatively, a heavily doped p-doped semiconductor region may be used instead. In one embodiment, the n-doped semiconductor regions can be embodied as discrete n-doped semiconductor material portions. In another embodiment, the n-doped semiconductor regions can be embodied as portions of a continuous n-doped semiconductor material layer. In one embodiment, each n-doped semiconductor region can be incorporated as a portion of a local bit line or electrode. In an alternative embodiment, a p-i-n diode, a Schottky diode or a metal-insulator-metal (MIM) non-linear device is used instead of a p-n diode.

While the present disclosure is described employing an embodiment in which the materials of the resistive memory material layers 80 are deposited first, and the materials of the steering element layers 82 are subsequently deposited, embodiments are expressly contemplated herein in which the order of deposition of the materials is reversed. In this case, outer sidewalls of the steering element layers 82 can contact sidewalls of the alternating stacks (30, 60) and sidewalls of the separator pillar structures 68, and inner sidewalls of the steering element layers 82 can contact outer sidewalls of the resistive memory material layers 80.

At least one conductive material is deposited in each remaining volume of the bit line cavities 47 to form vertical bit lines 90 (e.g., local bit lines). The at least one conductive material can include an elemental metal (e.g., tungsten, titanium, etc.), an intermetallic alloy, a conductive doped semiconductor material, and/or a conductive compound including at least one metal and at least one non-metal element such as a conductive metal nitride (e.g., TiN). Excess portions of the at least one conductive material can be removed from above the top surface of the insulating cap layer 62, for example, by a planarization process (such as chemical mechanical planarization and/or a recess etch).

The electrically conductive layers 30 and the global bit lines 10, and optionally, the vertical bit lines 90 can be suitably electrically wired for operation as a resistive random access memory device.

Figure 5A:
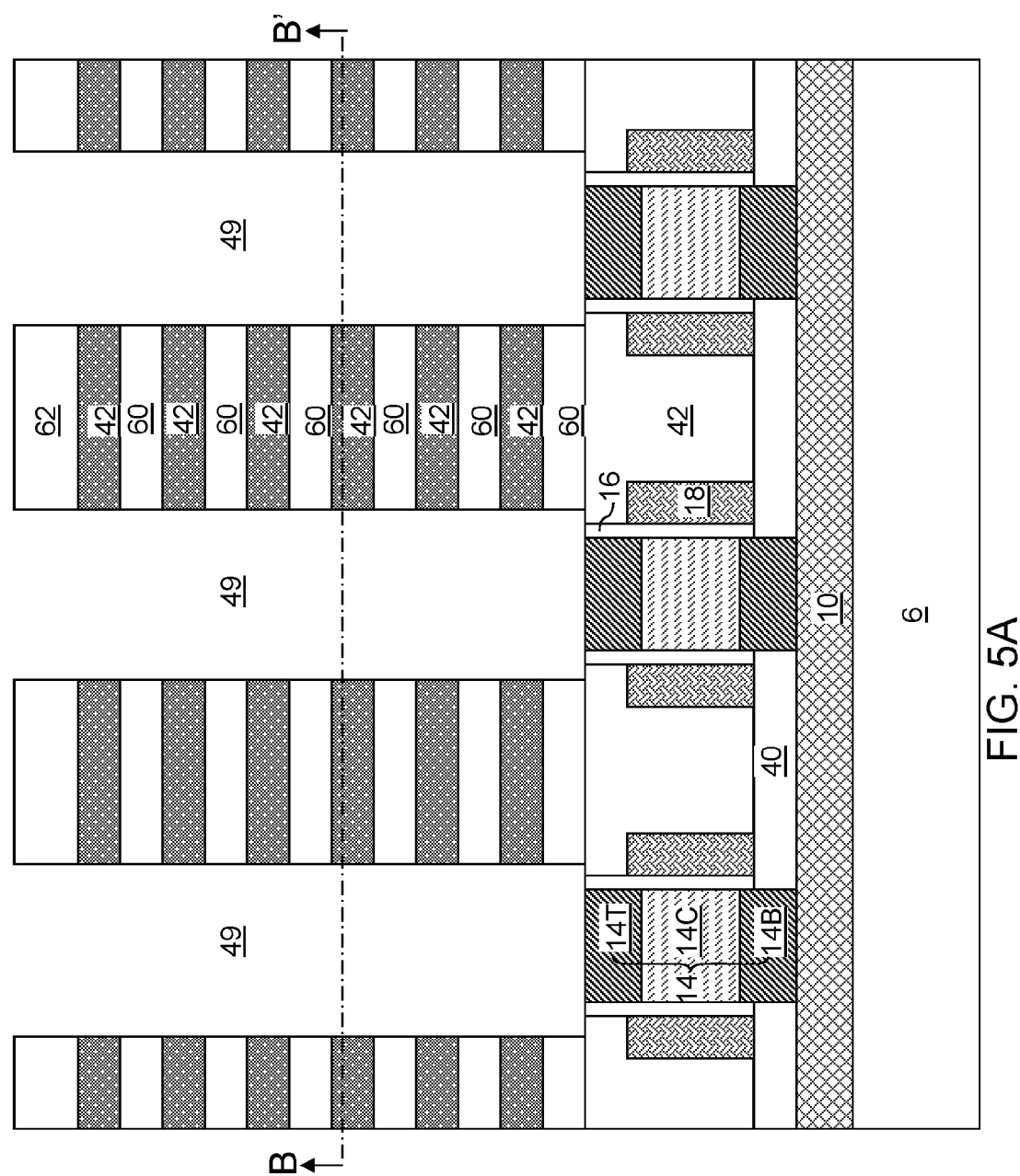
FIG. 5A is a vertical cross-sectional view of a second exemplary structure for forming a resistive random access memory device after formation of bit line access transistors, a dielectric fill layer, and a patterned alternating stack of insulating layers and sacrificial material layers according to an embodiment of the present disclosure.
Figure 5B:
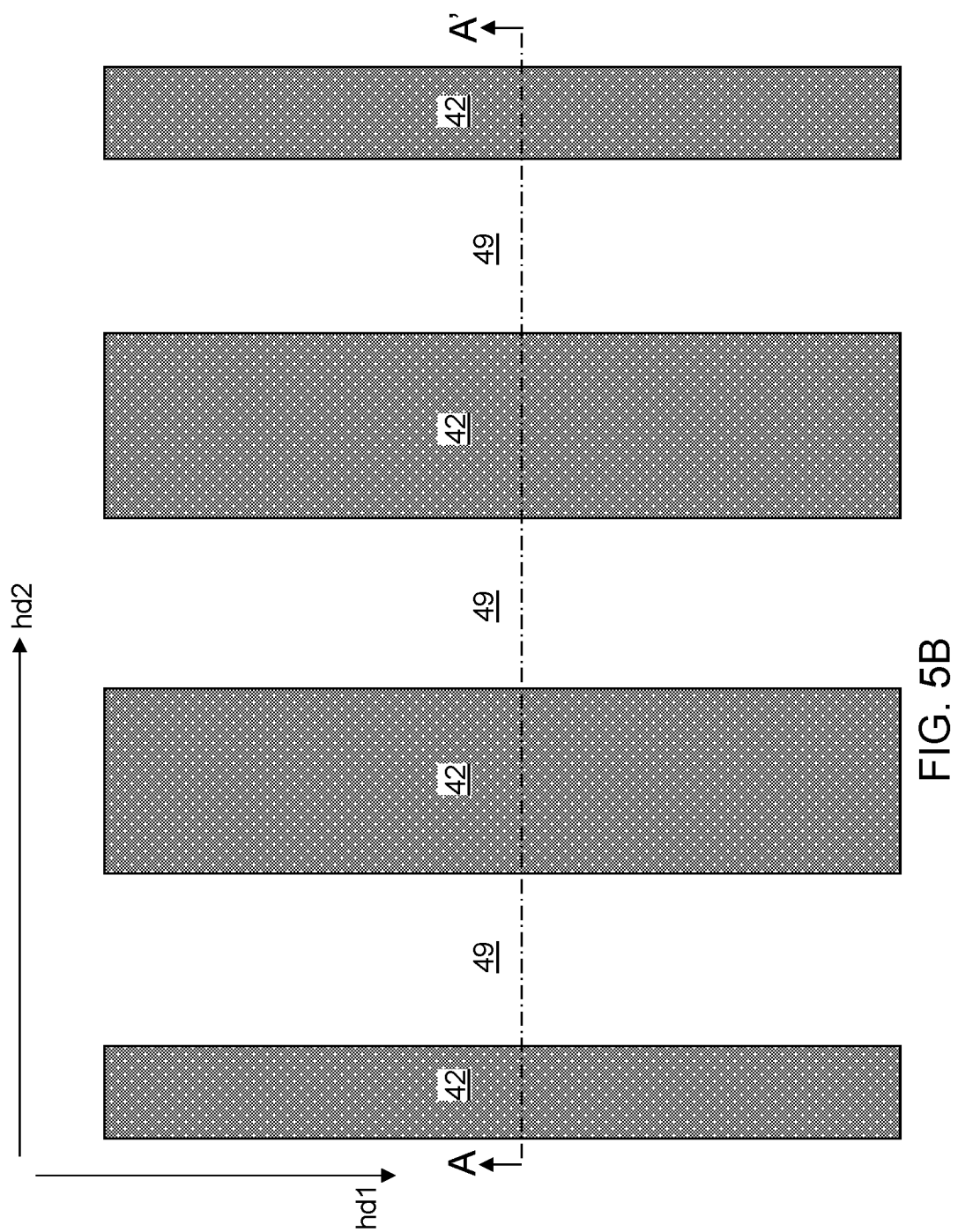
FIG. 5B is a horizontal cross-sectional view of the second exemplary structure of FIG. 5A along the horizontal plane B-B'. The vertical plane A-A' is the plane of the cross-section for FIG. 5A.

Referring to FIGS. 5A and 5B, a second exemplary structure according to an embodiment of the present disclosure can be derived from the first exemplary structure of FIGS. 1A-1D by replacing the electrically conductive layers 30 with sacrificial material layers 42. The sacrificial material layers 42 have a different composition than the insulating layers 60 and the insulating cap layer 62 (as patterned from a continuous blanket layer into multiple insulating cap layers 62 upon formation of the line trenches 49). In one embodiment, the sacrificial material layers 42 can include germanium, a silicon-germanium alloy, amorphous or polycrystalline silicon, or silicon nitride. In case the sacrificial material layers 42 include silicon nitride, the insulating layers 60 and the insulating cap layers 62 can include undoped silicate glass, and the separator pillar structures 68 to be subsequently formed can include organosilicate glass or doped silicate glass.

Figure 6A:
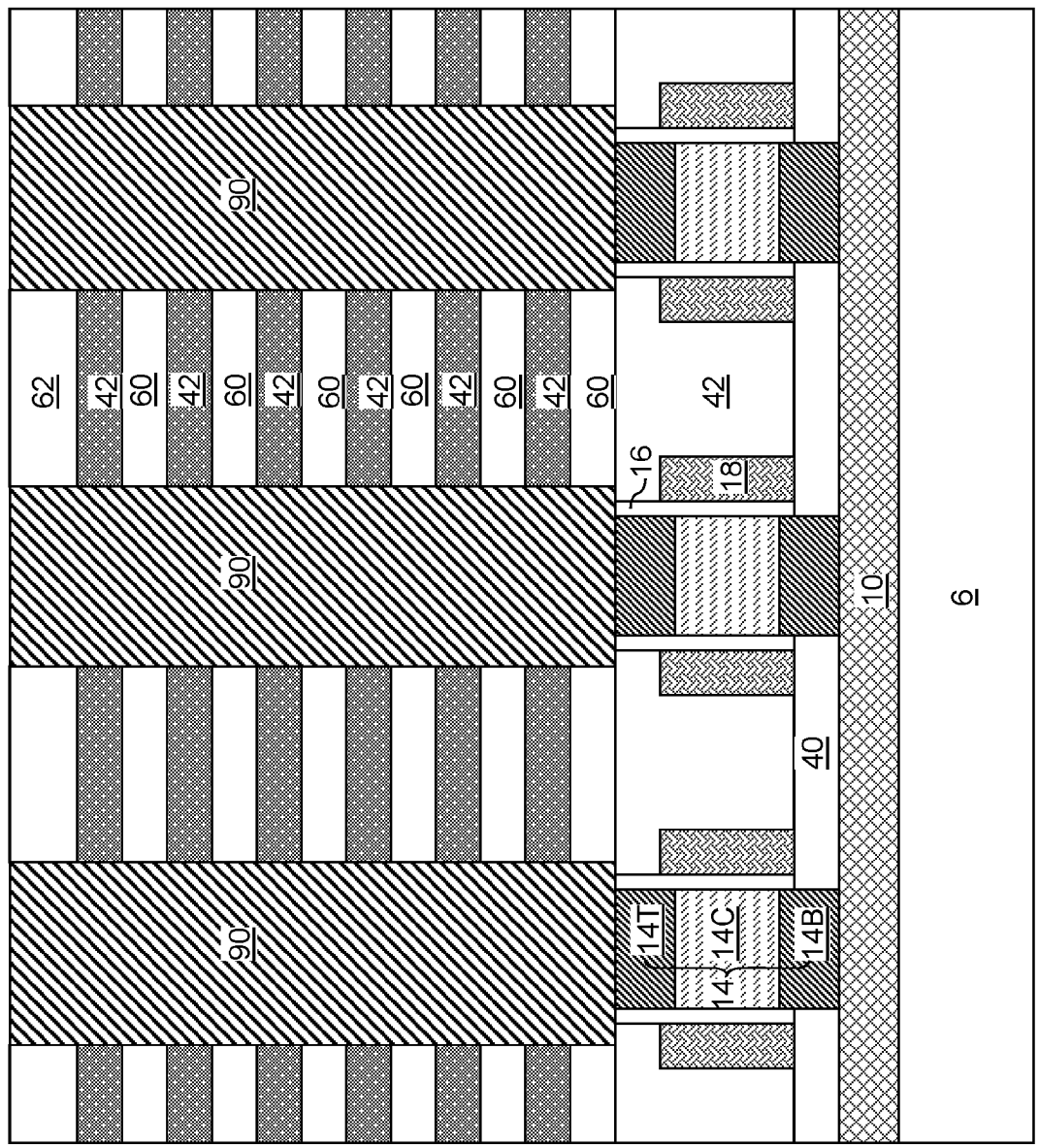
FIG. 6A is a vertical cross-sectional view of the second exemplary structure after formation of bit line structures according to an embodiment of the present disclosure.
Figure 6B:
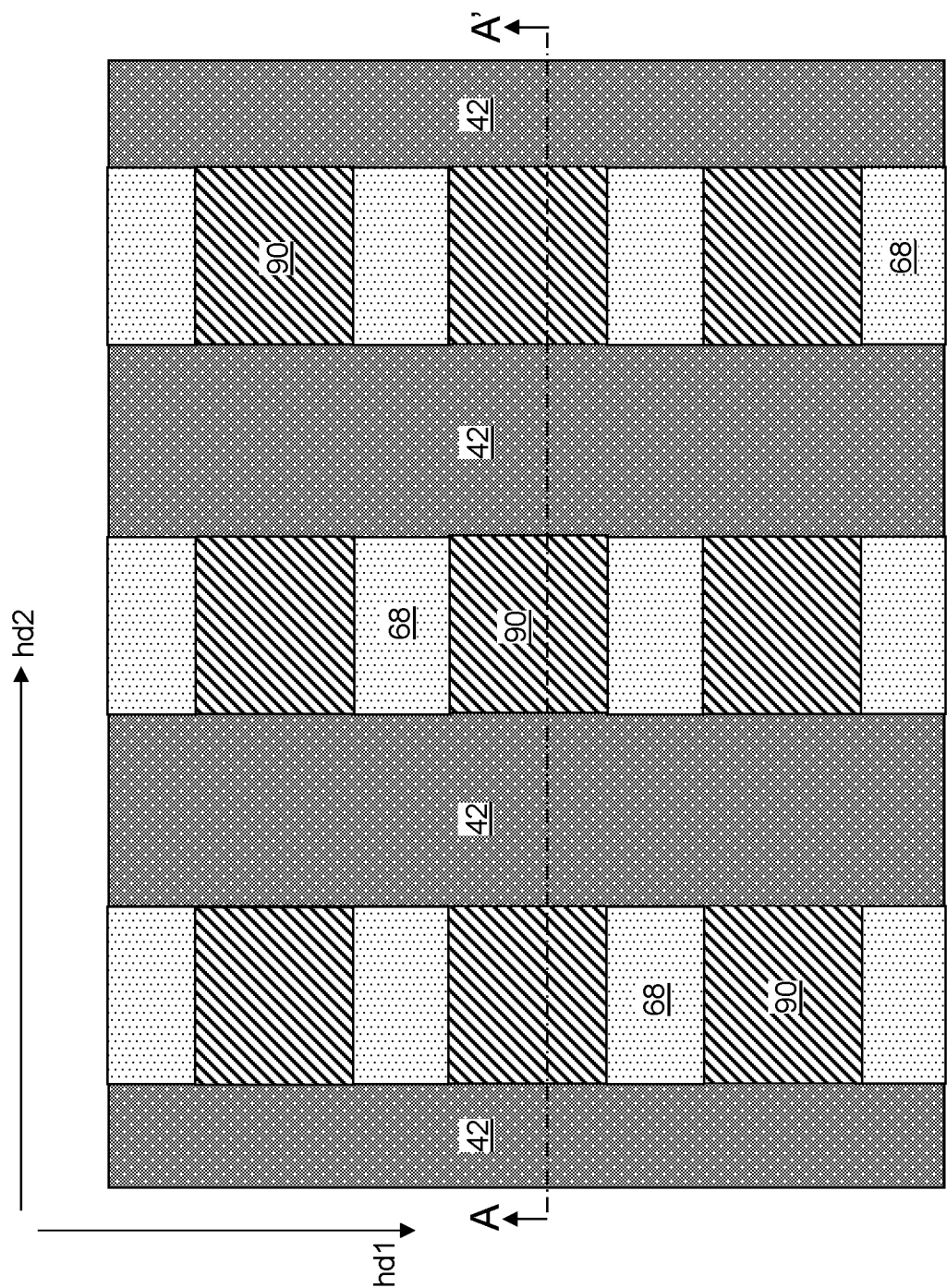
FIG. 6B is a horizontal cross-sectional view of second exemplary structure of FIG. 6A along the horizontal plane B-B'. The vertical plane A-A' is the plane of the cross-section for FIG. 6A.

Referring to FIGS. 6A and 6B, the processing steps of FIGS. 2A, 2B, 3A, and 3B can be performed to form bit line cavities 47 and separator pillar structures 68. Subsequently, the processing steps for forming the resistive memory material layers 80 and the steering element layers 82 may be performed, or may be omitted. Vertical bit lines 90 can be formed by deposition of at least one conductive material in the bit line cavities 47 employing the processing steps of FIGS. 4A and 4B. While the present disclosure is described employing an embodiment in which formation of the resistive memory material layers 80 and the steering element layers 82 is omitted, embodiments are expressly contemplated herein in which resistive memory material layers 80 and/or steering element layers 82 are formed prior to formation of the vertical bit lines 90. In this case, subsequent processing sequence can be appropriately modified to avoid duplicate formation of resistive memory material layers 80 and/or steering element layers 82.

Figure 7:
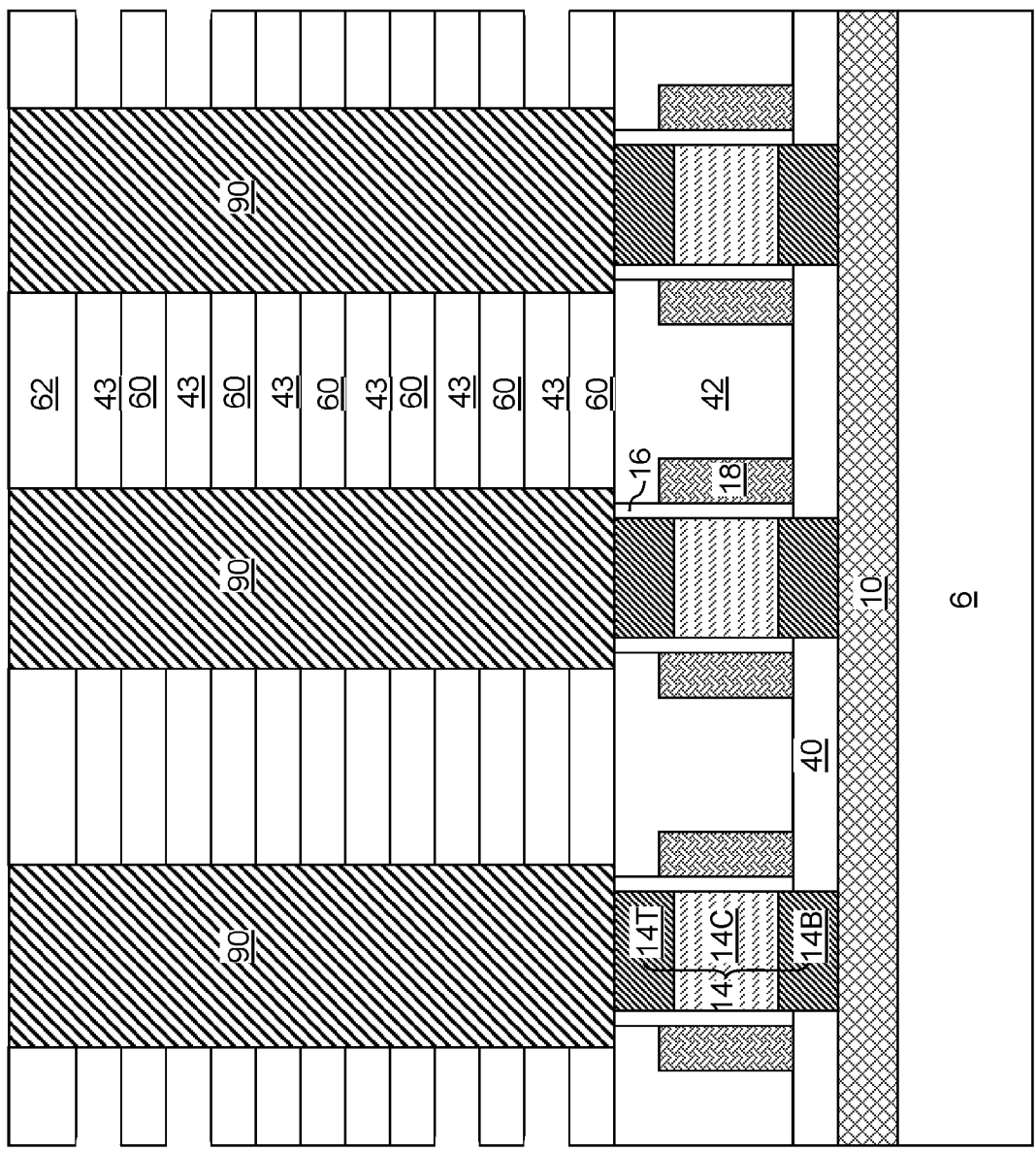
FIG. 7 is a vertical cross-sectional view of the second exemplary structure after formation of lateral recesses by removing the sacrificial material layers according to an embodiment of the present disclosure.

An access trench (not shown) extending through the insulating cap layers 62 and the alternating stacks (42, 60) can be formed. An etchant that etches the material of the sacrificial material layers 42 selective to the material of the insulating layers 60, the insulating cap layers 62, and the vertical bit lines 90 (or resistive memory material layers 80 or steering element layers 82 that contact sidewalls of the alternating stacks (42, 60)) can be introduced into the access trench. For example, if the sacrificial material layers 42 include germanium or a silicon-germanium alloy, a wet etch employing a combination of hydrogen peroxide and ammonium hydroxide can be employed to remove the sacrificial material layers 42. If the sacrificial material layers 42 include silicon nitride, a wet etch employing hot phosphoric acid can be employed to remove the sacrificial material layers 42. If the sacrificial material layers 42 include amorphous or polycrystalline silicon, a wet etch employing potassium hydroxide can be employed to remove the sacrificial material layers 42. Lateral recesses 43 can be formed in volumes from which the sacrificial material layers 42 are removed, as shown in FIG. 7.

Figure 8:
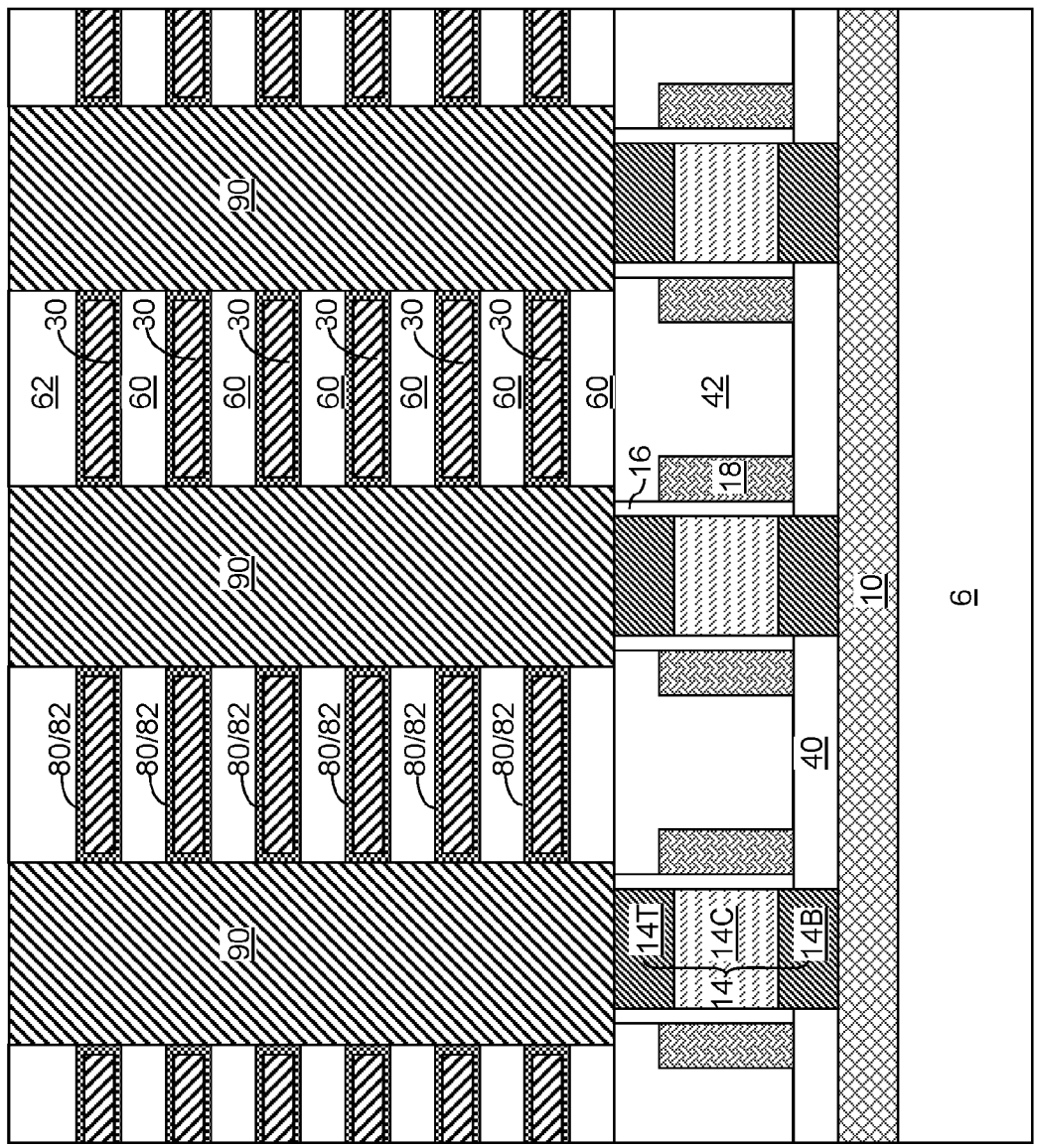
FIG. 8 is a vertical cross-sectional view of the second exemplary structure after formation of resistive memory layers and electrically conductive layers that constitute word lines of a resistive random access memory device according to an embodiment of the present disclosure.
Figure 9C:
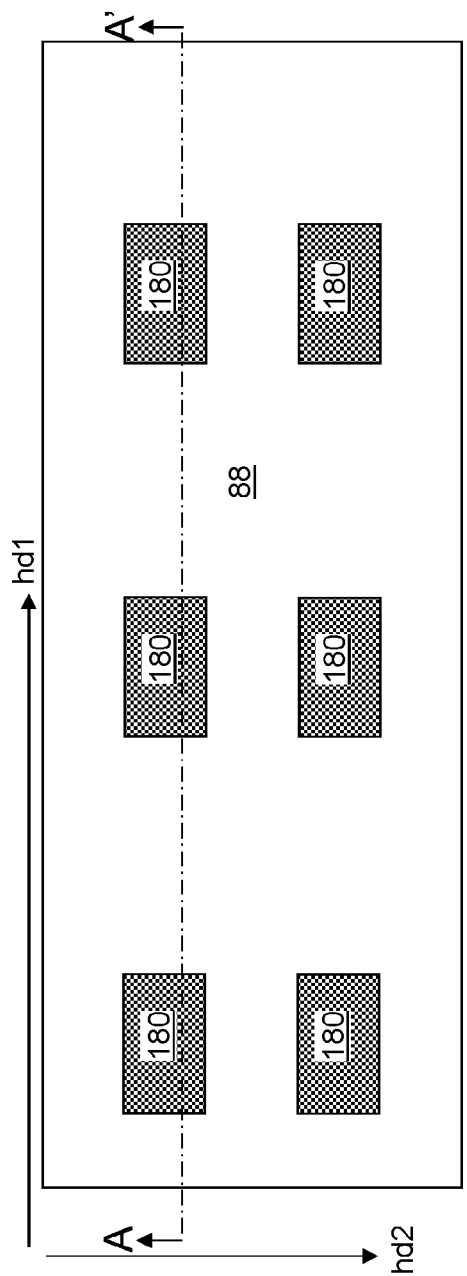
FIG. 9C is a horizontal cross-sectional view of the third exemplary structure of FIG. 9A along the horizontal plane C-C'. The vertical plane A-A' is the plane of the cross-section for FIG. 9A.
Figure 9D:
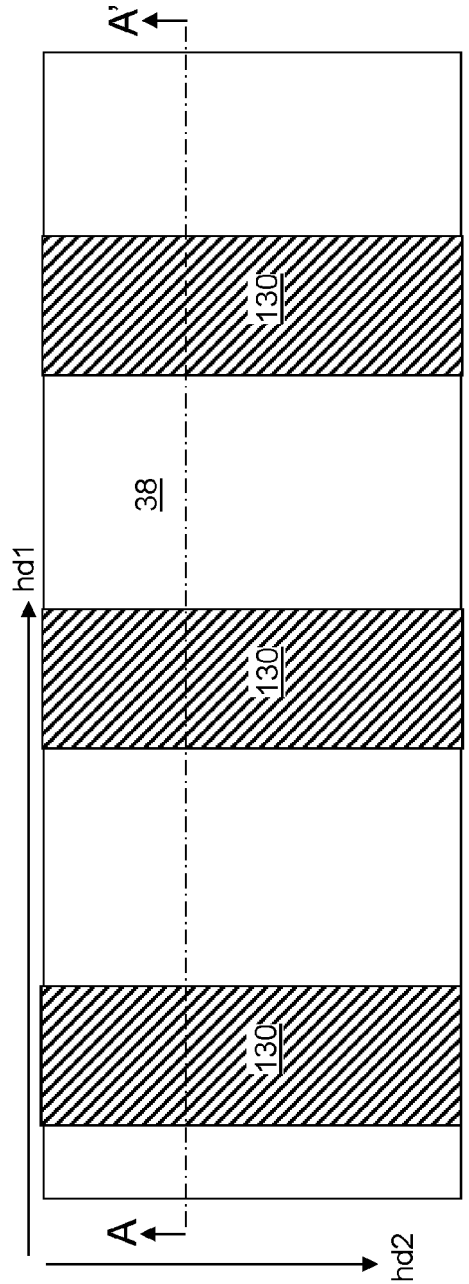
FIG. 9D is a horizontal cross-sectional view of the third exemplary structure of FIG. 9A along the horizontal plane D-D'. The vertical plane A-A' is the plane of the cross-section for FIG. 9A.

Referring to FIG. 8, if the resistive memory material layers 80 and/or the steering element layers 82 are not previously formed within the bit line cavities 47, the resistive memory material layers 80 and/or the steering element layers 82 can be formed in the lateral recesses 43 by deposition of suitable material layers. As discussed above, formation of steering element layers 82 is optional. At least one conductive material can be deposited in remaining volumes of the lateral recesses 43 to form electrically conductive layers 30, which can function as word lines of a resistive random access memory device.

Referring to FIGS. 9A-9D, a third exemplary structure is illustrated, which includes an array of resistive memory elements 180 in a criss-cross array (e.g., cross-bar) configuration. Electrically conductive lines 130 having the same composition as the electrically conductive lines 30 of the first and second exemplary structures can be formed at a first level. The electrically conductive lines 130 can extend along a first horizontal direction hd1 and can be laterally spaced from one another along a second horizontal direction hd2 by portions of a first dielectric material layer 38.

Each resistive memory element 180 can have the same layer stack as the resistive memory material layers 80 of the first and second exemplary structures. Each resistive memory element 180 can be in a two-dimensional array configuration with a first periodicity along the first horizontal direction hd1 and a second periodicity along the second horizontal direction hd2, which may, or may not, be perpendicular to the first horizontal direction hd1. Optionally, a steering element 182 can be formed over or under each resistive memory element 180. Each steering element 182 can have the same layer stack as the steering element layer 82 of the first and second exemplary structures.

The resistive memory elements 180 and the steering elements 182 can be formed by deposition of material layers over a combination of the electrically conductive lines 130 and the first dielectric material layer 38, and by patterning the stack of material layers. Subsequently, a dielectric matrix layer 88 including a dielectric material (such as silicon oxide) can be deposited and planarized to physically expose a top surface of vertical stacks of a resistive memory element 180 and a steering element 182. Each vertical stack (e.g., vertical pillar) of a resistive memory element 180 and a steering element 182 may have the resistive memory element 180 on top, or the steering element 182 on top.

A second dielectric material layer 98 and horizontal bit lines 190 can be formed over the vertical stacks of a resistive memory element 180 and a steering element 182. The horizontal bit lines 190 can have the same composition as the vertical bit lines 90 of the first and second exemplary structures. The second dielectric material layer 98 includes a dielectric material such as silicon oxide. The electrically conductive lines 130 and the horizontal bit lines 190 form a grid array (e.g., cross-bar array), and each vertical stack of a resistive memory element 180 and a steering element 182 can be located at the intersection point of the grid array to enable access by a combination of a selected electrically conductive line 130 and a selected horizontal bit line 180. The third exemplary structure can be integrated with a set of peripheral devices for controlling the electrically conductive lines 130 as word lines and the horizontal bit lines 190 as bit lines to provide a resistive random access memory device.

Figure 10:
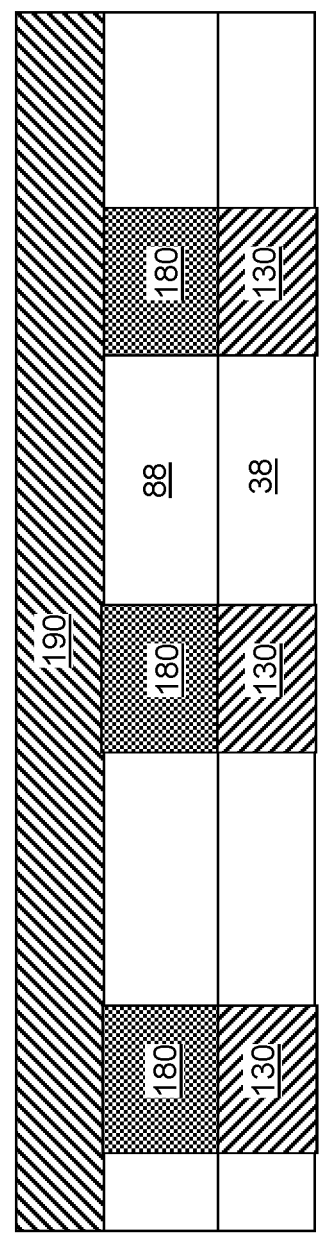
FIG. 10 is a vertical cross-sectional view of a modification of the third exemplary structure according to an embodiment of the present disclosure.

Referring to FIG. 10, a modification of the third exemplary structure is illustrated, which can be derived from the third exemplary structure by omitting the steering elements 182.

Figure 11:
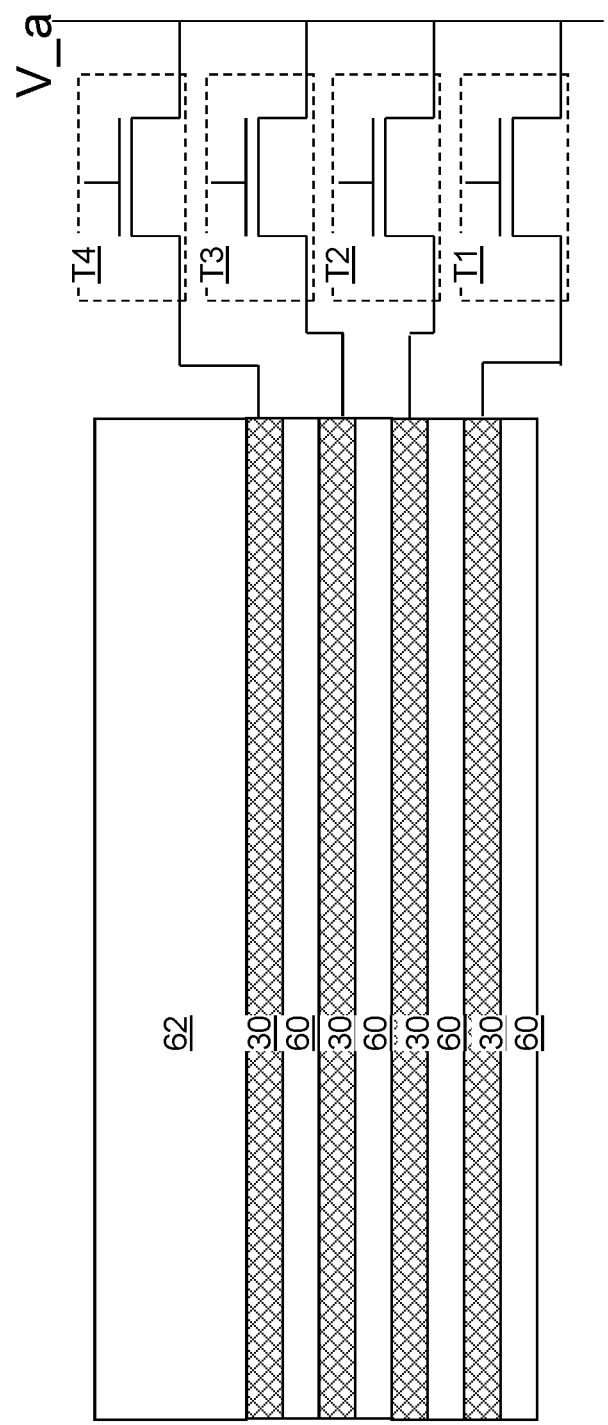
FIG. 11 is a schematic for word line access transistors connected to word lines in a resistive random access memory device.

Referring to FIG. 11, an exemplary peripheral device can be employed to access the electrically conductive layers 30 of the first and second exemplary structures (or the electrically conductive lines 130 of the third exemplary structure) as word lines. In this case, access transistors (T1-T4) can be employed, which can electrically bias each of the electrically conductive layers 30 at a suitable electrical bias voltage (referred to as an access voltage V_a) for accessing a respective set of resistive memory elements. A similar scheme can be employed with the vertical field effect transistors (14B, 14C, 14T, 16, 18).

Figure 12A:
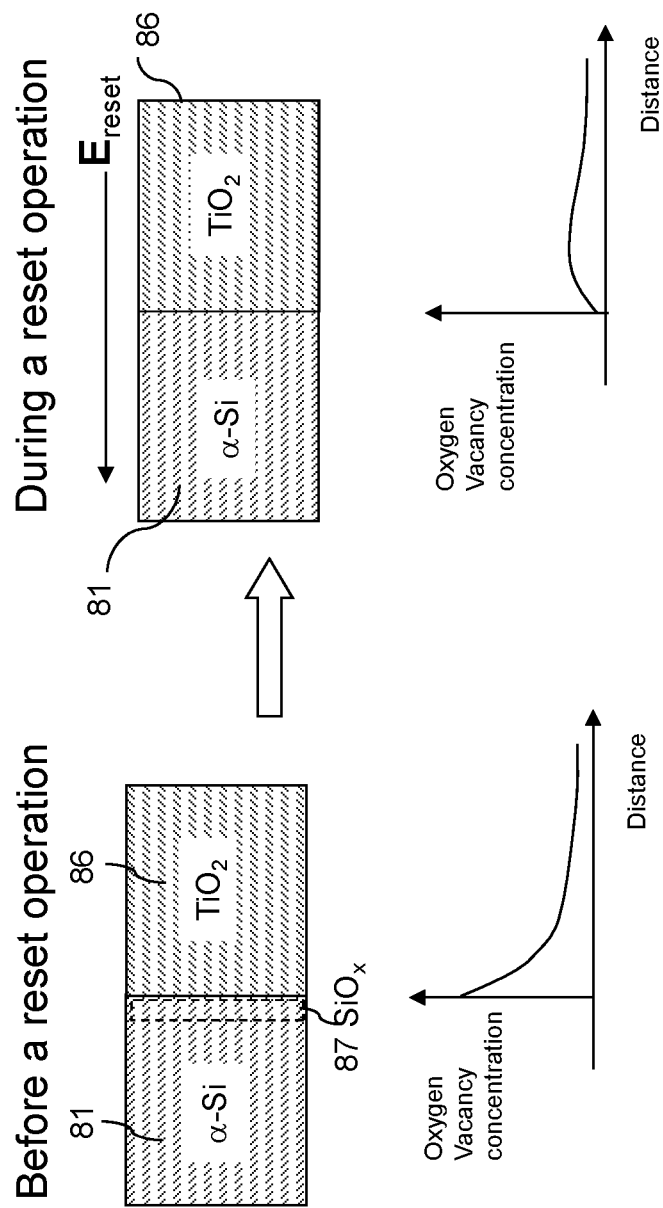
FIG. 12A is a schematic illustrating a reset operation of a prior art vacancy-modulated memory element.
Figure 12B:
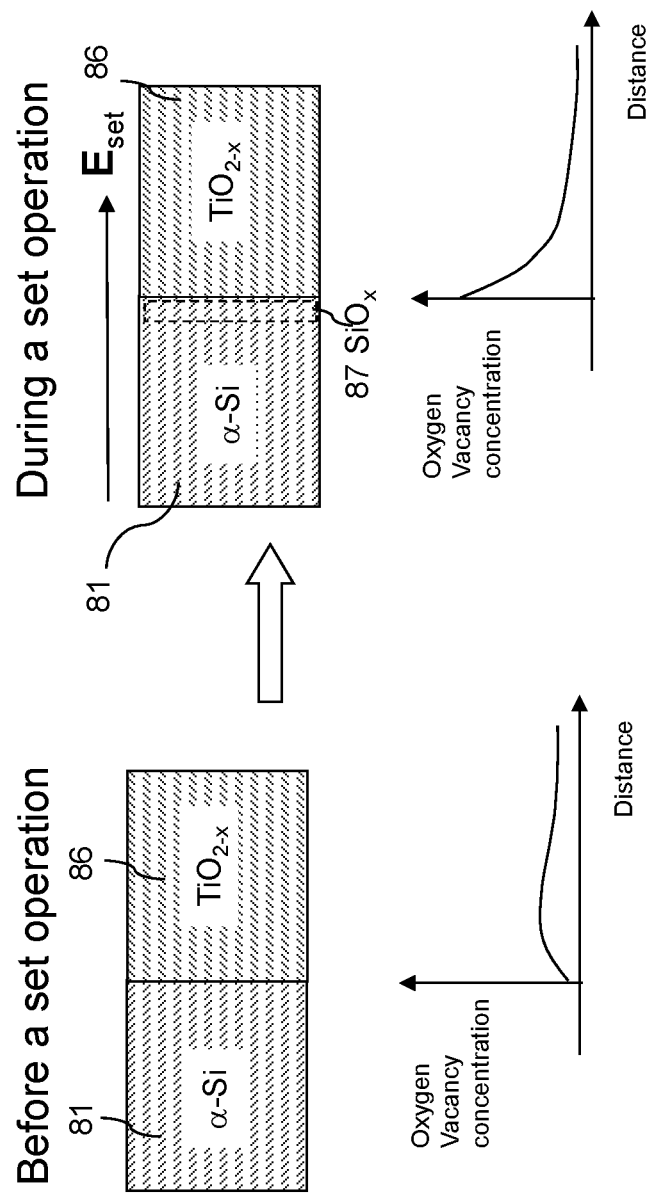
FIG. 12B is a schematic illustrating a set operation of the prior art vacancy-modulated memory element of FIG. 12A.

FIGS. 12A and 12B describe a general operating principle of one type of prior art vacancy-modulated conductive oxide (VMCO) memory devices. The exemplary prior art device contains an amorphous silicon barrier layer 81 and titanium oxide layer 86. A silicon oxide region 87 is formed at the interface of layers 81 and 86 due to the oxidation of the amorphous silicon layer 81 by migration of oxygen ions from the titanium oxide layer 86. Referring to FIG. 12A, operation of a prior art VCMO ReRAM during a reset switching process is illustrated. The switching mechanism in VMCO stack is generally understood as oxygen interstitial (Oi) generation from the silicon oxide region 87 near interface between layers 81 and 86 during the reset operation upon application of a reset electric field $E_{reset}$ (e.g., application of a positive voltage to an electrode which electrically contacts layer 86). The oxygen interstitials (Oi) generated from region 87 drift into vacancy rich titanium oxide layer 86 to recombine with the oxygen vacancies (Vo) within the titanium oxide layer. The recombination of Oi and Vo makes the titanium oxide material less conductive due to elimination of Vo, and the cell is switched into a high resistance state (HRS). In other words, the composition of the oxygen deficient titanium oxide layer 86 becomes stoichiometric (i.e., titanium dioxide) or closer to stoichiometric upon recombination of Oi and Vo. The graphs in FIG. 12A show the Oi concentration as a function of distance in the device before and after the reset operation.

Referring to FIG. 12B, operation of a prior VCMO ReRAM during a set switching process is illustrated. During the set operation, opposite polarity voltage is applied across the stack (e.g., a negative voltage applied to layer 86), and Ti—O bonds are broken in the titanium oxide layer 86 to generate Oi and Vo pairs. Oi will drift back to the interface between layers 81 and 86 along the set electric field $E_{set}$. Oi bond to silicon in layer 81 to form the interfacial silicon oxide region 87. Thus, consistent performance during the set operation requires consistent generation of the oxygen interstitials and oxygen vacancies. The graphs in FIG. 12B show the Oi concentration as a function of distance in the device before and after the set operation.

However, endurance of VMCO resistive random access memory cells suffers from fast degradation of low resistance state (LRS), in either single pulse cycling or incremental step pulse programming (ISPP) cycling. The shift of the LRS toward a high resistance state (HRS) closes the resistance window down, and limits the cell endurance in the range of about thousand cycles. It is desirable to increase the number of cycles for use of the VMCO ReRAM cells for storage class memory (SCM) applications by consistent generation of the oxygen interstitials and oxygen vacancies over more cycles than that in the prior art VMCO ReRAM cells of FIGS. 12A and 12B.

Figure 13A:
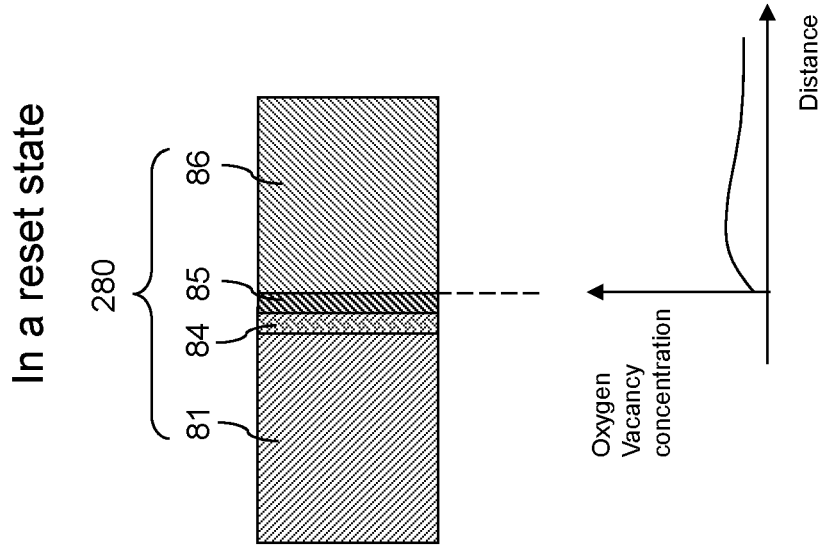
FIG. 13A illustrates a first exemplary resistive memory element according to a first embodiment of the present disclosure in a reset state.
Figure 13B:
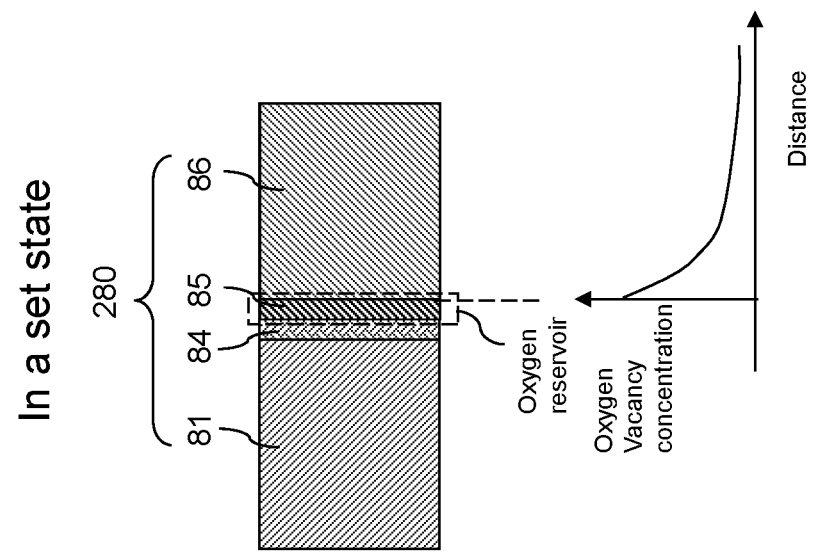
FIG. 13B illustrates the first exemplary resistive memory element according to the first embodiment of the present disclosure in a set state.

Referring to FIGS. 13A and 13B, a first exemplary resistive memory element 280 according to a first embodiment of the present disclosure is illustrated, which can be incorporated into any of the first, second, and third exemplary structures as a portion of a resistive memory material layer 80 or as a resistive memory element 180 described above. The first exemplary resistive memory element 280 includes a combination of a semiconductor material portion 81, a titanium dioxide portion 86, and at least one interfacial layer (84, 85) between the semiconductor material portion 81 and the titanium dioxide portion 86. The semiconductor material portion 81 may comprise a portion of the steering element (e.g., diode) 82 described above, or it may comprise a semiconductor material layer, such as an amorphous silicon layer, which is separate from the optional steering element 82 described above. The at least one interfacial layer (84, 85) can include a metal layer 84 and an interfacial metal oxide layer 85.

The semiconductor material portion 81 is located at one end of the first exemplary resistive memory element 280. The semiconductor material portion 81 functions as a barrier material layer that controls the amount of current through the resistive memory element 280. In one embodiment, the semiconductor material portion 81 includes an amorphous semiconductor material layer selected from silicon, germanium, a silicon-germanium alloy, a silicon-carbon alloy, a silicon-germanium-carbon alloy, and a III-V compound semiconductor material. Alternatively, a polycrystalline or single crystalline semiconductor material layer may be employed for the semiconductor material portion 81. The thickness (along the direction perpendicular to the interface between the semiconductor material layer 81 and the metal layer 84) can be in a range from 10 nm to 120 nm, although lesser and greater thicknesses can also be employed. Generally, a wider band gap material is formed with a lesser thickness, and a narrower band gap material is formed with a greater thickness.

The titanium oxide portion 86 includes a titanium oxide layer, and is located at the other end of the first exemplary resistive memory element 280. As used herein, titanium oxide refers to a dielectric compound of titanium and oxygen having a composition of $TiO_{2-\delta}$, in which $0 \le \delta \le 0.3$, such as $0.01 \le \delta \le 0.2$. The oxygen deficiency in the titanium oxide material occurs naturally due to the tendency of the titanium oxide material to generate oxygen vacancies to increase entropy. The thickness of the titanium oxide portion 86 (along the direction perpendicular to the interface between the titanium oxide portion 86 and the interfacial metal oxide layer 85) can be in a range from 20 nm to 200 nm, such as from 40 nm to 120 nm, although lesser and greater thicknesses can also be employed. In one embodiment, the titanium oxide portion 86 can be polycrystalline or single crystalline, such as a crystalline anatase phase of titanium oxide. In one embodiment, the titanium oxide portion 86 can have a maximum dimension (as measured between pairs of points on the surfaces of the titanium oxide portion 86) on the order of 100 nm, and the average crystal size of the titanium oxide portion 86 can be about the same as the volume of the titanium oxide portion 86. In this case, most instances of the titanium oxide portion 86 can be single crystalline.

The metal layer 84 can consist essentially of at least one elemental metal selected from titanium, a Group IVB element of the Periodic Table different from titanium (e.g., Zr or Hf), or a group VB element of the Periodic Table having one more electron in a second-from-outside shell than titanium (e.g., V, Nb, or Ta). The metal layer 84 can include a single elemental metal or two or more elemental metals selected from Ti, Zr, Hf, Ta, Nb, and V (e.g., a single metal layer, an alloy of the above metals or a stack of layers of the above metals). The metal layer 84 exhibits electronic characteristics similar to elemental titanium or is made of elemental titanium. Selection of at least one elemental metal having the same, or similar, outer electronic shell structures as titanium enables formation and/or stabilization of the metal oxide material in the interfacial metal oxide layer 85. In one embodiment, the metal layer 84 can consist essentially of an elemental metal selected from Ti, Zr, Hf, Ta, Nb, and V or intermetallic alloys thereof. In one embodiment, the metal layer can consist essentially of a same set of at least one elemental metal as at least one elemental metal that is present in the interfacial metal oxide layer 85. In one embodiment, the metal layer 84 can have a thickness in a range from 0.5 nm to 2 nm, although lesser and greater thicknesses can also be employed.

The interfacial metal oxide layer 85 can consist essentially of oxygen and at least one elemental metal selected from titanium, a Group IVB element different from titanium (e.g., Zr or Hf), or a group VB element having one more electron in a second-from-outside shell than titanium (e.g., V, Nb, or Ta). Thus, the interfacial metal oxide layer 85 can consist essentially of oxygen and at least one elemental metal selected from Ti, Zr, Hf, Ta, Nb, and V (i.e., an oxide of the metal of layer 84). The interfacial metal oxide layer 85 can be disposed between the metal layer 84 and the titanium oxide portion 86. The interfacial metal oxide layer 85 can have a thickness in a range from 0.5 nm to 3 nm, although lesser and greater thicknesses can also be employed.

In one embodiment, the interfacial metal oxide layer 85 comprises a non-stoichiometric metal oxide with oxygen deficiency. For example, the metal layer 84 may can be a titanium layer, and the interfacial metal oxide layer 85 can have a composition of $TiO_{2-\in}$, in which $\in$ is a variable number that changes with distance from the titanium oxide portion 86. The value of B can be in a range from 0.7 to 1.5, such as 0.8 to 1, within 50% of the volume of the interfacial metal oxide layer 85. The 50% of the volume of the interfacial metal oxide layer 85 can be at a center portion of interfacial metal oxide layer 85. In one embodiment, the titanium oxide portion 86 can have a greater oxygen to titanium ratio than an average oxygen to metal ratio in the interfacial metal oxide layer 85.

In one embodiment, the interfacial metal oxide layer 85 has an oxygen concentration gradient such that a concentration of oxygen increases with distance from the semiconductor material portion 81. The oxygen concentration can be essentially zero (corresponding to an B value at, or above 1.98) near the interface with the metal layer 84, and can be substantially the same as the value of δ at the interface with the titanium oxide portion 86.

Without wishing to be bound by a particular theory, it is believed that the oxygen vacancy distribution in the titanium oxide portion 86 changes depending on the programmed state of the resistive memory element 280 as follows. For example, in a set state, which is a low resistance state, the oxygen vacancy concentration in the titanium oxide portion 86 can be a strictly decreasing function with distance from the interface between portion 86 and the interfacial metal oxide layer 85, as illustrated in FIG. 13A. The oxygen vacancies in the titanium oxide portion 86 enable conduction through the titanium oxide portion 86 in the set state of FIG. 13A. Thus, the titanium oxide portion 86 is in a high conductivity state (i.e., a low resistivity state).

Upon application of a positive RESET bias voltage (on the order of 4 V to 12V) to the titanium oxide portion 86 relative to the voltage applied to the semiconductor material portion 81 in the structure of FIG. 13A, the oxygen interstitials migrate from the interfacial metal oxide layer 85 into the titanium oxide portion 86. The oxygen interstitials combine with the oxygen vacancies in the titanium oxide portion such that the concentration of the oxygen vacancies in the titanium oxide portion 86 decreases, as illustrated in FIG. 13B. The reduction in the concentration of oxygen vacancies in the titanium oxide portion 86 reduces electrical conduction through the titanium oxide portion 86 in the reset state of FIG. 13B. Thus, the titanium oxide portion 86 is in a low conductivity state (i.e., a high resistivity state). In this reset state, the interfacial metal oxide layer 85 is depleted of oxygen after the reset transition, and the value of a within the interfacial metal oxide layer 85 increases. If the interfacial metal oxide layer 85 is completely depleted of oxygen in the reset state to leave only metal atoms, then layer 85 may not be present between the metal layer 84 and the titanium oxide portion 86. Alternatively, not all oxygen is depleted from layer 85 and at least a portion of layer 85 remains between the metal layer 84 and the titanium oxide portion 86 in the reset state.

Upon application of a negative SET bias voltage (on the order of −12 V to −4 V) to the titanium oxide portion 86 relative to the voltage applied to the semiconductor material portion 81 in the structure of FIG. 13B, titanium-oxygen bonds are broken in the titanium oxide portion 86 to generate oxygen vacancies and oxygen interstitials in the titanium oxide portion 86. The oxygen interstitials migrate from the titanium oxide portion 86 to the interfacial metal oxide layer 85 to provide the set state illustrated in FIG. 13A. In this set state, the interfacial metal oxide layer 85 acts as an oxygen reservoir for a future reset transition, and the value of a within the interfacial metal oxide layer 85 decreases. While it is believed that the set and reset states described above are achieved due to oxygen interstitial migration, it is possible that oxygen vacancy migration may also occur in an opposite direction in addition to or instead of oxygen interstitial migration. It is believed that the device is non-filamentary in the set state. In other words, it is believed that no conductive filaments are formed in region 86 in the set state, and instead a bulk Vo increase throughout the height of region 86 (i.e., due to Oi generation and migration from region 86 to layer 85) is responsible for the low resistance state in the device.

The resistive memory element 280 of the embodiments of the present disclosure should provide enhanced endurance (i.e., higher number of cycles) with respect to the prior art resistive memory element illustrated in FIGS. 12A and 12B because the interfacial metal oxide layer 85 functions as an improved oxygen reservoir. Without wishing to be bound by a particular theory, it is believed that the metal (e.g., Ti, etc.) layer 84 and the interfacial (metal rich) metal oxide layer 85 function as a better oxygen ion scavenger than silicon in region 81 during the set operation due to thermodynamic driving force. In other words, during the set operation, it is believed that more Oi would be generated and drawn to the metal layer 84 (or any remaining metal rich interfacial oxide layer 85) in the device of FIG. 13A than would be drawn to the amorphous silicon layer 81 in the prior art device of FIG. 12B by the thermodynamic driving force. Specifically, it is believed that the presence of the metal layer 84 creates favorable thermodynamic conditions which facilitate breaking of titanium-oxygen bonds in the titanium oxide region 86 and generation of Oi and Vo pairs in this region 86. The Oi diffuse (i.e., drift) from region 86 toward the metal layer 84 and react with the metal atoms in the metal layer 84 or in the remaining interfacial metal oxide layer 85 (if layer 85 is present before the set operation) to re-form the interfacial metal oxide layer 85 on the metal layer 84 or to increase the oxygen concentration in the remaining layer 85. During the reset operation, the higher oxygen content in the interfacial metal layer 85 (than in the silicon oxide region 87 in the prior art device) is used to provide additional Oi which flow into region 86 and recombine with the Vo in the region 86.

Multiple instances of the resistive memory element 280 illustrated in FIGS. 13A and 13B can be incorporated into any of the first, second, and third exemplary structures or other known ReRAM configuration to provide a ReRAM device having superior endurance than prior art ReRAM devices.

FIGS. 14A-14C illustrate various methods for forming the resistive memory element 280 illustrated in FIGS. 13A and 13B. Referring to FIG. 14A, a metal layer 84 having the composition described above can be formed on a semiconductor material portion 81 having the composition described above. The metal layer 84 can be formed by atomic layer deposition or chemical vapor deposition. In one embodiment, the metal layer 84 can be deposited in a non-oxidizing environment so that the composition of the metal layer 84 does not change during or after deposition. Subsequently, a titanium oxide portion 86 having the composition described above can be deposited on the metal layer 84. Atomic layer deposition or chemical vapor deposition can be employed to form the titanium oxide portion 86. During or after deposition of the titanium oxide portion 86 directly on a surface of the metal layer 84, oxygen can diffuse from the titanium oxide portion 86 into the metal layer 84. The at least one elemental metal in the metal layer 84 is reactive, and thus, is capable of scavenging oxygen from the titanium oxide portion 86. If desired, an anneal (for example, at a temperature in a range from 300 degrees to 550 degrees) can be performed to increase diffusion of oxygen atoms from the titanium oxide portion 86 into an interfacial portion of the metal layer 84. The interfacial portion of the metal layer 84 into which the diffused oxygen atoms are incorporated becomes the interfacial metal oxide layer 85 described above. In other words, the interfacial metal oxide layer 85 is formed by diffusion of oxygen atoms from the titanium oxide portion 86 through an interface between the metal layer 84 and the titanium oxide portion 86. The interfacial metal oxide layer 85 comprises a non-stoichiometric metal oxide with oxygen deficiency (i.e., more oxygen deficient than region 86). The interfacial metal oxide layer 85 is formed with an oxygen concentration gradient such that a concentration of oxygen increases with distance from the semiconductor material portion 81.

Referring to FIG. 14B, the method illustrated in FIG. 14A can be modified to form a thinner metal layer 84, and to deposit an interfacial metal oxide layer 85 in a subsequent processing step. In this case, the thickness of the deposited metal layer 84 as deposited can be substantially the same as the target thickness in the structures illustrated in FIGS. 13A and 13B. The interfacial metal oxide layer 85 can be deposited employing a deposition process that is modified from the deposition process for the titanium oxide portion 86. Specifically, the interfacial metal oxide layer 85 can be formed employing an oxygen-containing environment, but which lacks sufficient oxygen to form a stoichiometric or oxygen rich metal oxide layer. For example, to form an oxygen deficient (metal rich) titanium oxide, the environment may have a reduced partial pressure of oxygen and/or reduced exposure time to oxygen-containing gases during the deposition process compared to those used to form stoichiometric or nearly stoichiometric titanium dioxide. Alternatively, plasma enhanced atomic layer deposition (PEALD) which includes ammonia in the deposition ambient may be used to deposit the oxygen deficient interfacial metal oxide layer 85. Subsequently, a titanium oxide portion 86 can be formed on layer 85 employing the same processing step describe above. The interfacial metal oxide layer 85 comprises a non-stoichiometric metal oxide with oxygen deficiency. The interfacial metal oxide layer 85 is formed with an oxygen concentration gradient such that a concentration of oxygen increases with distance from the semiconductor material portion 81.

Referring to FIG. 14C, another method of forming the resistive memory element 280 of FIGS. 13A and 13B is provided. A titanium oxide portion 86 can be formed on a preexisting surface in a first, second, or third exemplary structure. A metal layer 84 can be deposited on the titanium oxide portion 86. An interfacial metal oxide layer 85 can be formed by the same mechanism that forms the interfacial metal oxide layer 85 in the method illustrated in FIG. 14A. Alternatively, an interfacial metal oxide layer 85 and a metal layer 84 can be sequentially formed as two separate material layers employing the deposition processes of FIG. 14B applied in reverse order. In this case, oxygen atoms are incorporated into the interfacial metal oxide layer 85 during deposition of the interfacial metal oxide layer 85. Subsequently, a semiconductor material portion 81 having the composition described above can be formed over the metal layer 84. The interfacial metal oxide layer 85 comprises a non-stoichiometric metal oxide with oxygen deficiency. The interfacial metal oxide layer 85 is formed with an oxygen concentration gradient such that a concentration of oxygen increases with distance from the semiconductor material portion 81.

Figure 15A:
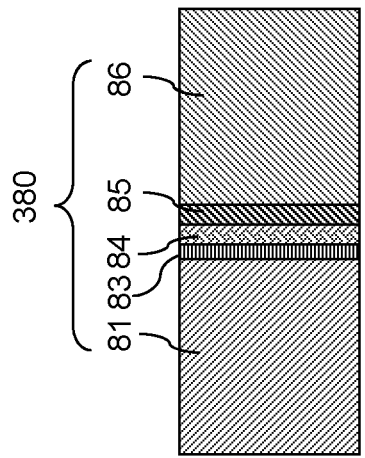
FIG. 15A illustrates a second exemplary resistive memory element according to a second embodiment of the present disclosure in a reset state.
Figure 15A:
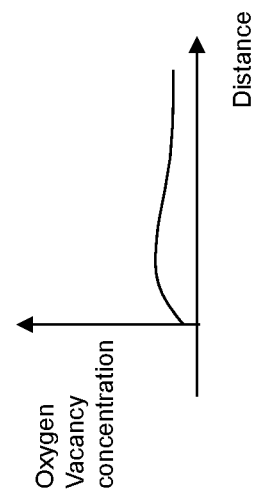
Figure 15B:
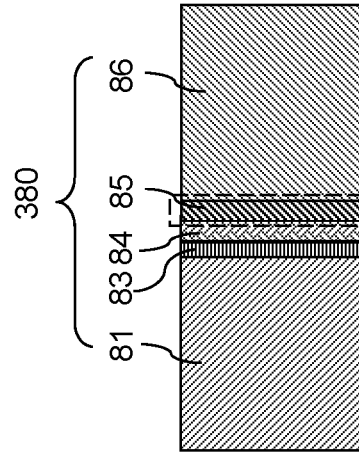
FIG. 15B illustrates the second exemplary resistive memory element according to the second embodiment of the present disclosure in a set state.
Figure 15B:
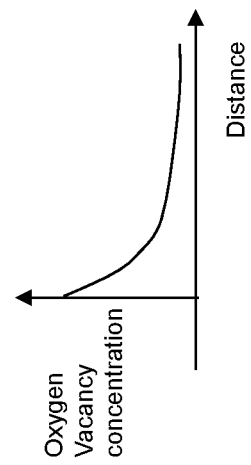

Referring to FIGS. 15A and 15B, a second exemplary resistive memory element 380 according to a second embodiment of the present disclosure is illustrated. The second exemplary resistive memory element 380 can be derived from the first exemplary resistive memory element 280 by incorporating an additional electrically conductive layer 83 into the at least one interfacial layer (84, 85). Layer 83 is formed between the metal layer 84 and the semiconductor material portion 81, and does not form a compound with the semiconductor material portion 81 (for example, by formation of a metal-semiconductor alloy such as a metal silicide) and functions as a tunneling barrier material. The additional electrically conductive layer 83 has a thickness in a range from 0.5 nm to 1.5 nm (such as from 0.5 nm to 1.0 nm), and includes a material that can be conformally deposited by atomic layer deposition or chemical vapor deposition. Thus, the additional electrically conductive layer 83 is preferably a high work function metal or metal compound (e.g., having a higher work function than layer 84) which typically does not form a silicide by reaction with silicon in region 81. For example, the additional electrically conductive layer 83 can be a ruthenium, titanium nitride or tantalum nitride layer. The combination of layer 83 and region 81 can improve the non-linearity of the resistive memory element 380 during the operation, i.e. during the switching between the set state and the reset state.

Referring to FIGS. 16A-16C, various processes for forming the second exemplary resistive memory element 380 is illustrated, which are derived from the processes for forming the first exemplary resistive memory element 280 shown in FIGS. 14A-14C, respectively, by depositing layer 83 between the processing step that forms the semiconductor material portion 81 and the processing step that forms the metal layer 84.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A vacancy-modulated conductive oxide resistive memory element comprising:
 a semiconductor material portion;
 a titanium oxide portion; and
 at least one layer disposed between the semiconductor material portion and the titanium oxide portion, wherein the at least one layer is selected from a metal layer selected from Ti, Zr, Hf, Ta, Nb, and V, and an interfacial metal oxide layer consisting essentially of oxygen and at least one elemental metal selected from Ti, Zr, Hf, Ta, Nb, and V wherein the at least one layer comprises both the metal layer and the interfacial metal oxide layer;
 a first feature that the metal layer comprises a titanium layer and the interfacial metal oxide layer comprises an oxygen deficient non-stoichiometric titanium oxide layer having a higher metal to oxygen ratio than the titanium oxide portion, wherein the oxygen deficient non-stoichiometric titanium oxide layer has a formula $TiO_{2-\epsilon}$ in which $\epsilon$ is a variable number that changes with distance from the titanium oxide portion in range from 0.7 to 1.5, and the titanium oxide portion comprises a crystalline anatase titanium oxide which has a formula $TiO_{2-\delta}$ in which $0 \le \delta \le 0.3$.

2. The resistive memory element of claim 1, wherein the resistive memory element comprises the first feature.

3. The resistive memory element of claim 2, wherein:
$\epsilon$ changes with distance from the titanium oxide portion in range from 0.8 to 1; and
$0.01 \le \delta \le 0.2$.

4. The resistive memory element of claim 1, wherein the interfacial metal oxide layer has an oxygen concentration gradient such that a concentration of oxygen increases with distance from the semiconductor material portion.

5. The resistive memory element of claim 1, wherein the interfacial metal oxide layer has a thickness in a range from 0.5 nm to 3 nm and the metal layer has a thickness in a range from 0.5 nm to 2 nm.

6. The resistive memory element of claim 1, further comprising an electrically conductive layer having a higher work function than the metal layer, wherein the electrically conductive layer is located between the metal layer and the semiconductor material portion.

7. The resistive memory element of claim 6, wherein the electrically conductive layer comprises a ruthenium layer.

8. The resistive memory element of claim 1, wherein the semiconductor material portion comprises an amorphous semiconductor material selected from silicon, germanium, a silicon-germanium alloy, a silicon-carbon alloy, a silicon-germanium-carbon alloy, and a III-V compound semiconductor material.

9. The resistive memory element of claim 1, wherein the semiconductor material portion comprises an amorphous silicon portion.

10. The resistive memory element of claim 9, further comprising a ruthenium layer located between the titanium layer and the amorphous silicon portion.

11. The resistive memory element of claim 1, wherein the resistive memory element is a non-filamentary memory element which changes resistivity due to oxygen interstitial diffusion during set and reset operations.

12. A resistive random access memory device comprising a plurality of resistive memory elements of claim 1 and a plurality of steering elements located between a plurality of bit lines and a plurality of word lines.

13. A method of operating a resistive memory element comprising a semiconductor material portion, a titanium oxide portion and a metal layer disposed between the semiconductor material portion and the titanium oxide portion, the method comprising:
applying a set voltage to the element to generate oxygen interstitials and oxygen vacancies in the titanium oxide portion and to diffuse the oxygen interstitials to the metal layer to form an oxygen reservoir; and
applying a reset voltage to the element to diffuse oxygen from the oxygen reservoir into the titanium oxide portion to provide the oxygen interstitials which recombine with the oxygen vacancies in the titanium oxide portion,
wherein:
the semiconductor material portion comprises an amorphous silicon portion;
the metal layer comprises a titanium layer;

the interfacial metal oxide layer comprises an oxygen deficient non-stoichiometric titanium oxide layer having a higher metal to oxygen ratio than the titanium oxide portion;
the oxygen deficient non-stoichiometric titanium oxide layer has a formula $TiO_{2-\epsilon}$ in which $\epsilon$ is a variable number that changes with distance from the titanium oxide portion in range from 0.7 to 1.5; and
the titanium oxide portion comprises a crystalline anatase titanium oxide which has a formula $TiO_{2-\delta}$ in which $0 \le \delta \le 0.3$.

14. The method of claim 13, wherein:
the oxygen reservoir comprises an interfacial metal oxide layer located between the metal layer and the titanium oxide portion;
applying the set voltage comprises applying a negative voltage to the titanium oxide portion to place the memory element in a lower resistivity state; and
applying the reset voltage comprises applying a positive voltage to the titanium oxide portion to place the memory element in a higher resistivity state.

15. A method of forming a resistive memory element, comprising forming a combination of a semiconductor material portion and a titanium oxide portion with at least one interfacial layer therebetween, wherein the at least one interfacial layer comprises an element selected from Ti, Zr, Hf, Ta, Nb, and V and intermetallic alloys thereof, wherein:
the at least one interfacial layer comprises an interfacial metal oxide layer consisting essentially of oxygen and at least one elemental metal selected from Ti, Zr, Hf, Ta, Nb, and V;
the interfacial metal oxide layer is formed with an oxygen concentration gradient such that a concentration of oxygen increases with distance from the semiconductor material portion;
the interfacial metal oxide layer comprises a non-stoichiometric metal oxide with oxygen deficiency;
the semiconductor material portion comprises an amorphous semiconductor material selected from silicon, germanium, a silicon-germanium alloy, a silicon-carbon alloy, a silicon-germanium-carbon alloy, and a III-V compound semiconductor material;
the semiconductor material portion comprises an amorphous silicon portion;
a titanium layer is located between the interfacial metal oxide and the semiconductor portion;
the interfacial metal oxide layer comprises an oxygen deficient non-stoichiometric titanium oxide layer having a higher metal to oxygen ratio than the titanium oxide portion;
the oxygen deficient non-stoichiometric titanium oxide layer has a formula $TiO_{2-\epsilon}$ in which $\epsilon$ is a variable number that changes with distance from the titanium oxide portion in range from 0.7 to 1.5;
the titanium oxide portion comprises a crystalline anatase titanium oxide which has a formula $TiO_{2-\delta}$ in which $0 \le \delta \le 0.3$; and
the resistive memory element is a non-filamentary memory element which changes resistivity due to oxygen interstitial diffusion during set and reset operations.

16. The method of claim 15, further comprising depositing a metal layer consisting essentially of at least one elemental metal selected from Ti, Zr, Hf, Ta, Nb, and V on the semiconductor material portion or on the titanium oxide portion, wherein the interfacial metal oxide layer is formed by diffusion of oxygen atoms from the titanium oxide portion through an interface between the metal layer and the titanium oxide portion.

17. The method of claim 15, further comprising depositing a stack of a metal layer and the interfacial metal oxide layer on the semiconductor material portion or on the titanium oxide portion.

18. The method of claim 15, wherein the at least one interfacial layer further comprises a ruthenium layer formed between the semiconductor material portion and the metal layer.

* * * * *